United States Patent
Sinn et al.

(10) Patent No.: US 11,406,042 B2
(45) Date of Patent: Aug. 2, 2022

(54) MODULAR ELECTRONICS HOUSING CONCEPT

(71) Applicant: SINN Power GmbH, Gauting (DE)

(72) Inventors: Philipp Sinn, Gauting (DE); Dominik Schwaiger, Gauting (DE)

(73) Assignee: SINN Power GmbH, Gauting (DE)

( * ) Notice: Subject to any disclaimer, the term of this patent is extended or adjusted under 35 U.S.C. 154(b) by 331 days.

(21) Appl. No.: 16/830,444

(22) Filed: Mar. 26, 2020

(65) Prior Publication Data
US 2020/0315065 A1 Oct. 1, 2020

(30) Foreign Application Priority Data
Mar. 29, 2019 (DE) ...................... 10 2019 002 350.1

(51) Int. Cl.
*H05K 7/20* (2006.01)
*H02K 5/173* (2006.01)
(Continued)

(52) U.S. Cl.
CPC ....... *H05K 7/20409* (2013.01); *H02K 5/1732* (2013.01); *H02K 5/18* (2013.01);
(Continued)

(58) Field of Classification Search
CPC .......................... H05K 7/20409; H02K 5/1732
See application file for complete search history.

(56) References Cited

U.S. PATENT DOCUMENTS

| 8,842,437 B2 * | 9/2014 | Chang ...................... G06F 1/20 361/704 |
| 2004/0032717 A1 * | 2/2004 | Aldon .................. H05K 9/0015 361/698 |

(Continued)

FOREIGN PATENT DOCUMENTS

| DE | 202006009669 U1 | 8/2006 |
| DE | 102012220280 A1 | 5/2014 |

*Primary Examiner* — Mukundbhai G Patel
(74) *Attorney, Agent, or Firm* — Marshall, Gerstein & Borun LLP

(57) ABSTRACT

Electronic module for the mounting of electronic components comprising a housing that is bounded in a longitudinal direction by two end faces, each with an opening. The housing can be fitted via the openings with at least one first circuit board, equipped with electronic components, and with at least one second circuit board, equipped with plug and/or clamp connectors. On an inner side of one housing wall, the housing comprises at least one dome, configured in a longitudinal direction, on which the at least one first circuit board can be attached essentially transversely to the longitudinal direction. At two opposite-facing inner sides and/or two opposite-facing domes, the housing furthermore comprises a retaining groove in which to insert at least one second circuit board in a longitudinal direction. The at least one first circuit board is wirelessly electrically connected to the at least one second circuit board inside the housing for the transmission of electrical power and communication signals via plug and/or clamp connectors, wherein additional plug and/or clamp connectors are arranged on the at least one second circuit board in such a way that plug and/or clamp connectors of another electronics housing module can be wirelessly connected to the at least one second circuit (Continued)

board by means of plug and/or clamp connectors for the transmission of electrical power and communication signals.

20 Claims, 11 Drawing Sheets

(51) Int. Cl.
| | |
|---|---|
| H02K 5/18 | (2006.01) |
| H02K 5/20 | (2006.01) |
| H02K 5/22 | (2006.01) |
| H02K 7/18 | (2006.01) |
| H02K 9/19 | (2006.01) |
| H05K 1/14 | (2006.01) |
| H05K 5/00 | (2006.01) |
| H05K 7/14 | (2006.01) |
| F03D 15/00 | (2016.01) |

(52) U.S. Cl.
CPC ............... *H02K 5/20* (2013.01); *H02K 5/225* (2013.01); *H02K 7/183* (2013.01); *H02K 9/19* (2013.01); *H05K 1/144* (2013.01); *H05K 5/0008* (2013.01); *H05K 7/1427* (2013.01); *H05K 7/2049* (2013.01); *H05K 7/20218* (2013.01); *F03D 15/00* (2016.05); *H02K 2213/12* (2013.01); *H05K 2201/042* (2013.01); *H05K 2201/064* (2013.01)

(56) References Cited

U.S. PATENT DOCUMENTS

2006/0216965 A1* 9/2006 Yamanashi .......... H05K 5/0021
2012/0019111 A1* 1/2012 Buescher ............... H02B 1/308
312/109

* cited by examiner

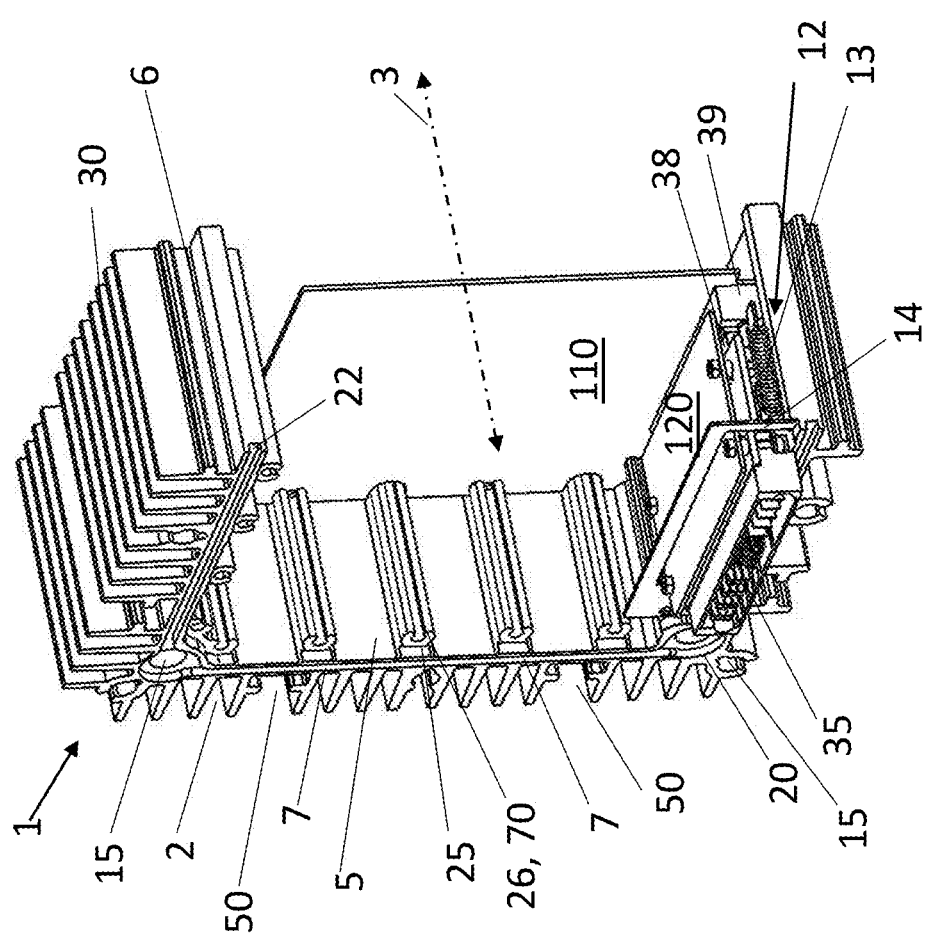

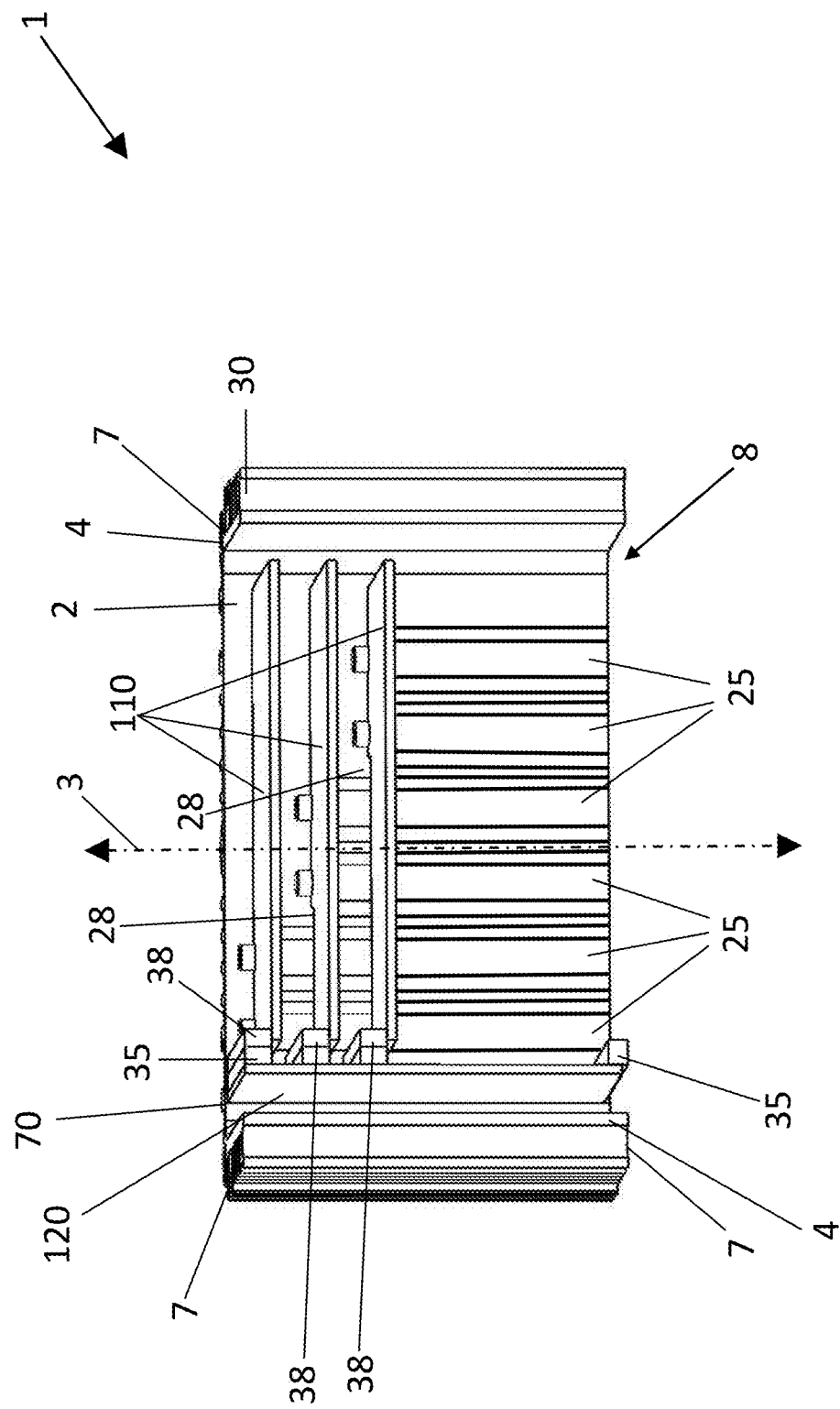

MODULAR ELECTRONICS HOUSING CONCEPT

CROSS-REFERENCE TO RELATED APPLICATION

Priority is claimed to German Patent Application No. 10 2019 002 350.1, filed Mar. 29, 2019, and the entire contents thereof are incorporated herein by reference.

FIELD OF THE DISCLOSURE

The invention relates to a modular electronics housing concept or an electronic module concept with a housing for mounting electronic components. The housing of an electronic module according to the invention can be used to mount at least circuit boards with electronic components positioned on, in or up against them as well as other electronic components as required by the application in question.

BACKGROUND

A wide range of electronic components are used in the most diverse applications, whereby the aim is to establish an individual configuration of electronic components for each use. At the same time, however, the aim is to ensure a high degree of reproducibility of common parts and/or standard parts, in particular for electronics mounting devices and their attachment.

In view of the increase in the conversion of renewable energies and the increase in electromobility, the demands for the individual configuration of electronics and power electronics assemblies is growing in the area of power electronics too, whereby modular configuration utilizing as many common parts or standard parts as possible is becoming increasingly important, not least for cost reasons.

An electronics housing is known from DE 10 2012 220 280 A1 which can be used to mount converters such as DC/DC, AC/DC, DC/AC and AC/AC converters for the purpose of voltage conversion or frequency conversion. In order to achieve a modular structure of a power electronics system which is adapted to its use, electronic housings are provided which can be connected by means of a flange-to-flange connection so as to adapt the volume of the electronic housing to the power electronics system required.

DE 20 2006 009 669 U1 shows a housing system with a modular structure for mounting electronic parts, whereby the housing is composed of individual extruded sections. The housing can be scaled in modular fashion using suitable profile connection pieces, front faceplates and rear panels arranged transversely to the direction of extrusion.

GENERAL DESCRIPTION

The object of the present invention is to provide electronic components in a modular structure in which both a (power) electronics system tailored to match the needs in question and electronic assemblies can be mounted, whereby the electronic system can be configured simply in modular fashion so as to enable adaptation to the respective application. The aim is to largely avoid any elaborate installation effort, especially that which is required so as to achieve sufficient shielding or screening. In order to mount and assemble an electronic system designed specifically for the respective application, a housing is to be provided using simple, robust and low-cost means which can be used to configure the electronic system required for the application in question in modular fashion.

The objective is achieved by means of an electronic module according to claim 1 which exhibits a housing in which electronic components or power electronics components such as voltage converters, frequency converters, resistors, capacitors, accumulators, batteries and the like can be mounted. In a longitudinal direction, the height/length of the housing is bounded by two end faces, each of which comprises an opening. Through these openings, the housing can be fitted with at least one first circuit board and with at least one second circuit board. Two types of circuit board are essentially used here, a first circuit board (functional circuit board) which is fitted with electronic components for current conversion and/or frequency conversion and/or the like and a second circuit board (power circuit board) which establishes a wireless power and communication connection between at least one first circuit board and the second circuit board. The second circuit board also exhibits at least one free end—preferably the end that is applied at the opening of the mounted electronic module—other suitable plug and/or clamp connectors so that an additional second circuit board can be connected to it in order to enable the transmission of electrical power and communication signals between the second circuit boards. To this end, the second circuit board can for example be connected to a second circuit board of an additional electronic module or to another second circuit board inside the same housing.

Given the configuration of the second circuit board according to the invention with at least two plug and/or clamp connectors—one for connection to the first circuit board and one for connection to another second circuit board—all connections can be established for wireless transmission of electrical power and communication signals, both inside the housing and between the modules. Firstly, this avoids elaborate connection of shielding elements between the individual electronic components, which are normally applied manually. Secondly, the communication connections can specifically be used to transmit or relay control, switch and measurement signals in addition to the communication signals. In the subsequent description of the present invention, all these signals are grouped together under the term communication signals.

In order to fit an electronic module according to the invention, several first circuit boards can be connected to a second circuit board, whereby for example two second circuit boards can be used so that the electronic module can be fitted with assemblies comprising one or more first circuit boards and one second circuit board. Here, connection of the two second circuit boards inside the housing is also established by means of suitable plug and/or clamp connectors.

In another embodiment, several first circuit boards can be connected in parallel in an essentially transverse manner to the longitudinal direction of the housing and attached to domes there. Here it is also conceivable that the second circuit board is fixed in its position in the housing simultaneously via the plug and/or clamp connector of the first circuit board to the second circuit board. According to the invention, it is preferable to insert the at least one second circuit board in the housing via retaining grooves which are arranged on opposite-facing inner sides of the housing wall. The invention also provides for retaining grooves on at least two opposite-facing domes in addition or alternatively to the retaining grooves on the inner side of the housing. In this way, several longitudinally aligned first and/or second circuit boards can be mounted parallel to each other. These can be connected to first circuit boards, which are screwed to the domes in the transverse direction, for example, via appropriate plug and/or clamp connectors. According to the invention, plug and/or clamp connectors are arranged on the outward-facing edges of the second circuit boards, by means of which the respective second circuit boards of additional electronic modules can be wirelessly connected to each other for the purpose of transmitting electrical power and communication signals.

By combining a simply constructed housing with a housing wall running in the longitudinal direction, on which at least one dome is arranged on an inner side and on which a retaining groove is formed in each case on at least two pairwise opposite-facing housing inner sides and/or domes, it is possible to attach at least one circuit board, fitted with electronic components and aligned essentially transversely to the longitudinal direction, to the at least one dome in a simple and cost-effective manner. By means of second circuit boards or connection boards aligned essentially in the longitudinal direction of the housing, a simple but reliable power and communication connection is also provided between the circuit boards of an electronic module as well as between the circuit boards of several electronic modules, achievable without undue effort required for shielding.

The idea according to the invention enables electronics pre-assembly groups to be inserted into the housing via the retaining grooves and fixed in the housing in the longitudinal direction, for example by means of a dome in the housing, whereby the retaining grooves simultaneously provide a fixation in directions transverse to the longitudinal direction. It goes without saying that a connection to two or more domes formed in the housing falls within the skill of the art and is therefore covered by the inventive concept. Likewise, the formation of a through-hole, a blind hole and/or a thread in one or more domes for attaching the first circuit board by means of a screw connection is also within the skill of the art and is therefore also covered by the invention. However, all other types of connection for fixing the at least one first circuit board such as by means of clamping pins, gluing, soldering, welding or the like, are also conceivable according to the invention.

To the person skilled in the art, it is evident that for the arrangement of the first circuit board transversely to the longitudinal direction and therefore also for the positioning of the second circuit board in longitudinal direction, the domes with or without retaining grooves on the inner side of the housing can be adjusted in height or length. As a result, it is in accordance with the invention that the height or length of the domes in the longitudinal direction of the housing can be adapted to the respective application. The inventive concept also covers the possibility of varying the length or height of the individual domes even during the manufacture of the housing or doing so subsequently in a material-removing process in order to be able to vary the position of a first circuit board in the housing or arrange several first circuit boards parallel to each other in the housing. In the latter case, the individual circuit boards exhibit the relevant cut-outs so that the domes not required for mounting a board can pass through the cut-outs and be available for the attachment of another board or another electronic component. Further according to the invention, the housings of the electronic modules can be fitted from both end faces via the respective openings so that the height or length of the domes can also be adjusted from both sides according to the invention.

According to the invention, the housings of the electronic modules are preferably manufactured from a metal, for example by extrusion, continuous casting or (pressure) casting, preferably from aluminium or an aluminium alloy. Similarly, manufacture using a machining process or even a low-pressure process is conceivable, but this must be assessed with regard to cost in each individual case. Other materials are also conceivable for the manufacture of the housing of the electronic module according to the invention, such as zinc or magnesium, depending on the application. In addition, plastic can be considered as a housing material, for example, as it can be easily formed by means of injection moulding or extrusion. In general, continuous or semi-continuous processes such as extrusion are preferable for the manufacture of the housing. However, serial-part or single-part manufacture is also conceivable and may be preferred for reasons of economy or quality.

If continuous or semi-continuous processes are used to manufacture the housing, the domes run along the entire height of the housing wall from one end face to the other end face, since long or endless profiles are manufactured in these processes and the housings according to the invention are produced by being cut to length as required. This means that these domes, completely formed between the two end faces, have to be adapted in length or height by means of post-processing as required. Here it is preferable to form any slots or retaining grooves in the domes during the manufacture of the housing. The person skilled in the art recognizes that such retaining grooves/slots in domes can also be inserted later, although this is likely to be more complex in most cases. In other processes, such as casting or injection moulding, the domes can be formed in their required length right away, with and without slots, in such a way that subsequent reworking may be unnecessary. For a more universal application of the individual housings, however, it is also conceivable in this case to have the domes run from one end surface to the other end surface. This would still allow later adaptation to the specific application.

In an exemplary embodiment of the housing, liquid cooling channels are incorporated in the housing wall in the longitudinal direction which enable direct liquid cooling of the housing or indirect liquid cooling of the electronic components arranged inside the housing wall when their waste heat is transferred to the housing wall or to the liquid cooling channels. If at least two electronic modules are strung together in the longitudinal direction, it is possible to pass cooling liquid between the individual housing parts via the cooling channels, whereby sealing agents can be arranged between the two housings.

In addition or as an alternative to the aforementioned liquid channels, the profiled housing wall can also exhibit cooling fins which extend essentially in planes parallel to the longitudinal direction so that they can be moulded or demoulded in the manufacturing process. These cooling fins preferably protrude to the outside in order to be able to dissipate heat generated by the electronics inside the housing to the environment. Here it is also possible for the cooling fins to protrude inwards into the housing so that heat generated inside the housing wall can be absorbed in the immediate vicinity of the heat source and be conducted by the cooling fins, for example making use of the good thermal conductivity of aluminium, to the outer side of the housing wall, from where the heat radiates to the surroundings. In a further embodiment, the domes can also be fitted with cooling fins to further improve heat dissipation from the inside of the housing. It is also conceivable that unmachined domes in particular, i.e. domes that run from one end face to the other end face, could also be used as a fluid channel. In particular, using the interplay between cooling fins protruding outside and inside and in combination with liquid channels running in or on the housing wall or in the domes, a good cooling effect can be provided for the electronic system mounted in the electronic module through the combination of air and liquid cooling, especially for a power electronics system with semiconductor components such as MOSFETs or similar, for example.

In another preferred embodiment of the housing according to the invention, the liquid cooling channels are integrated into the cooling fins so that the heat generated in the housing can be dissipated to liquid-cooled cooling fins. Effective heat transfer from a heat source inside the housing to the outside of the housing can also be achieved in this way.

In a further embodiment, at least one additional spring-loaded clip can be attached to the at least one dome in such a way that the clamping force acts essentially transversely to or at an angle to the longitudinal direction. Here, the clip is preferably screwed to the dome in the longitudinal direction, whereby this can be implemented simultaneously with the fixing of the first circuit board or also from the side of the dome not occupied by a circuit board. According to the invention, the clip can be placed before or after the insertion of the first circuit board, thereby generating a pressing force for the first circuit board in the direction of the point of connection with the second circuit board.

In another preferred embodiment, other electronic components, for example a MOSFET, can be pressed against the housing wall by means of the spring-loaded clip which is attached to at least one dome, in such a way that enables planar heat conduction between the electronic component and the inside of the housing wall. Such an arrangement is preferred in the case of electronic components that are subject to high thermal stress, i.e. that generate large amounts of heat, since these require a high cooling capacity. In the implementation of such an arrangement, for example for MOSFETs, the latter are placed on the first circuit board in such a way that they are positioned after insertion of the first circuit board next to the at least one dome or, if there are several domes, between the domes. The clip is then attached to the dome from the other side in each case so that the spring force of the spring-loaded clip presses the electronic component flat against the inside of the housing wall. In this way, the heat output generated in the electronic component, for example in the MOSFET, during operation can easily be dissipated to the housing wall, whereby the housing wall can be cooled by cooling fins and/or liquid channels, as explained above. The person skilled in the art is aware, especially when using metal housings, that it may be necessary to ensure electrical insulation between the housing wall and the electronic component to prevent short circuits. Usually the housings of the electronic components already provide such electrical insulation.

The exemplary embodiment described above for just one additional electronic component (MOSFET) and one clip can also be applied to a number of such electronic components by using, for example, a terminal strip exhibiting several spring-loaded clips that press the electronic components against the inner side of the housing wall, preferably between the domes. Here it is also conceivable for the terminal strip to be fitted with different types of springs so that different types of electronic components capable of being positioned between the domes, such as MOSFETs, resistors, coils, capacitors, etc., can be pressed flat against the inside surface of the housing wall in the manner according to the invention. Both individual clips and terminal strips can be attached to the domes of the housing in a comprehensible manner so that the respective clip between two domes can exert its spring effect. It is preferable to screw the clip or the terminal strip to the dome or domes, possibly requiring a previously inserted thread in the respective dome. Alternatively, the domes can also exhibit through-holes into which, for example, self-tapping screws can be screwed or threaded inserts can be inserted. When fastening a clip or a terminal strip, it is irrelevant whether the dome(s) to which the clip or terminal strip is attached is/are provided with a slot or a retaining groove for longitudinally oriented circuit boards.

However, it not only falls within the skill of the art that the clips or the terminal strip are arranged on domes formed on the inner side of the housing. The arrangement of a clip or a terminal strip on domes positioned on the outside of the housing is also covered by the inventive concept, as is the arrangement of at least one clip or terminal strip on cooling fins, through-holes or liquid channels, each formed on the inside and/or on the outside of the housing. Here, the choice of an adequate attachment method, such as screwing or welding, falls within the skill of the art, as does the addition of attachment aids such as the insertion of threaded inserts.

When assembling the housings of electronic modules in a modular manner to form electronic assemblies, for example, it is preferably necessary to ensure dust-tightness and/or water-tightness between the housing joint surfaces, which can be achieved, for example, by means of an appropriate sealing surface on the end surfaces or by means of a sealing contour on the end surfaces to accommodate an O-ring. For this purpose it is preferable, especially in the case of continuous/semi-continuous manufacturing processes for the housing, to subsequently machine the end surfaces if the housing (sections) are cut out of a long profile string. If such housing sections are used, the domes for attaching the first circuit board can be machined at the same time, for example, using the same set-up on a machine tool. However, depending on the requirements for the housing connection or depending on the flexibility of the position of the circuit boards in the housing and the required quantity, preference may be given to continuous or semi-continuous or single-part production for the housing.

In a further embodiment, the housing of the electronic module according to the invention exhibits a frame-like, profiled housing wall that is closed in the circumferential direction in the manner of a tube or a rectangular duct, for example. In particular, if the housing is manufactured by means of an extrusion or continuous casting process, all the contours of the profile run without interruption from one end surface to the other end surface. As is commonly known to the person skilled in the art, long to very long and if necessary even endless profiles can be produced in the above-mentioned manufacturing processes, which are subsequently divided into individual sections for the electronic module according to the invention. Here, the height of the housing can be cut to length and varied depending on the application. In general, it is therefore conceivable that when a (power) electronics system is assembled, for example for a wave power plant, the housings are available as uncut strings which can be cut to length in a suitable manner on site, for example by the manufacturer of the wave power plant. As already indicated above, once the individual housings have been cut to length, the end surfaces and also the dome height(s) may have to be adapted for suitable accommodation of the first circuit boards with the electronic components on them. It may be necessary to machine the end surfaces in order to provide a flat sealing surface or a sealing contour to accommodate a flat seal or an O-ring seal. The use of an additional seal may not be necessary if the end surfaces or sealing surfaces are surface-machined so precisely that direct contact between two sealing surfaces is sufficient to seal the electronic system. Depending on the application, a dust-tight seal may also be sufficient here. Other possibilities for sealing two housings are familiar to the person skilled in the art such as adhesive seals made of silicone, the use of soft seals or the application of sealing foams, etc., and are therefore covered by the inventive concept.

In other applications, especially if the electronic modules according to the invention are used outdoors, at least one water-tight seal is often required between the housings. Furthermore, a liquid-tight seal between the housings is particularly advisable if cooling liquid for cooling the housing or the electronic components mounted inside it is to be passed from one housing to the other housing in liquid channels which are inserted in the longitudinal direction in the housing wall. These cooling channels can be arranged outside and/or inside a sealing contour, whereby in the case of liquid channels arranged inside the sealing contour care should be taken to provide an (additional) seal between the individual liquid channels, in particular in the transition from one housing to the other housing.

For the modular assembly of electronic modules in the longitudinal direction according to the invention, through-holes are preferably provided in the housing wall by means of which the individual housings can be held together by means of a screw or clamp connector. By means of these through-holes, a force acting in the longitudinal direction perpendicular to the end surfaces can be generated, whereby not only a flow of force can be transmitted via the housing walls, but also sufficiently high pressing forces can be achieved on the seals potentially present between the housings and/or liquid channels. As in the case of the liquid channels, the through-holes can also be configured integrally with the cooling fins, for example, in order to keep the installation space of the housings small while at the same time maximizing the heat radiation surface. Here it is understandable to the person skilled in the art that these through-holes for connecting several housings in the longitudinal direction can be arranged both outside a sealing contour and inside a sealing contour. Furthermore, it is evident to the person skilled in the art that the through-holes can be threaded, for example so as to arrange several electronic modules one after the other in longitudinal direction by means of screw connections. The arrangement of threaded inserts in the through-holes is also covered by the inventive concept.

In a further embodiment, these through-holes can also take the form of liquid channels and vice versa. Accordingly, hollow-drilled alignment pins can be inserted into the individual through-holes or liquid channels which, on the one hand, enable the connection of the liquid channels or through-holes while at the same time providing a seal between the liquid channels and also acting as positioning or centring pins. It goes without saying that, according to the invention, solid alignment pins can also be applied in unused through-holes or liquid channels for positioning and centring two adjacent housings. Such alignment pins, whether hollow or solid, can simultaneously serve as protection from incorrect assembly, for example by variation of length, diameter, cross section etc., thereby offering a certain degree of security to ensure that only those electronic modules can be connected to each other that are compatible.

However, if fitting sleeves or similar are inserted into the through-holes or fluid channels as described above, their suitability as receptacles for attachment elements or for the passage of coolants is still ensured. In a special embodiment, these hollow alignment pins can also be tubes that can be inserted into the fluid channels, whereby, if the tubes are passed through several electronic modules, the relevant sealing of the individual housings may not be necessary. The term tubes also includes flexible tubes, such as hoses. When using aluminium or aluminium alloys as the housing material in particular, copper tubes or plastic hoses are often used to protect cooling pumps. If such tubes or hoses are intended for the circulation of coolant, the domes which accommodate the coolant lines can also be slotted in configuration, thereby serving as mounts for circuit boards which can be arranged in a longitudinal direction.

In a further embodiment of the invention, for example, end components which close the housing(s) in the longitudinal direction can be attached to an electronic module according to the invention or to a string of electronic modules according to the invention. The connection between the housing and the end components can be designed to be dust-tight or fluid-tight by means of a seal. The person skilled in the art is familiar with numerous methods for connecting an end component and an electronic module. For example, the end components can exhibit through-holes in which a threaded rod is accommodated which is also accommodated in the through-holes arranged in collinear fashion of one or more electronic housings. By tightening nuts that are screwed externally on opposite-facing sides of the threaded rod, a clamping force can be generated that presses the housings and end components together. In another embodiment, the housings can be provided with threaded boreholes which are aligned with through-boreholes in the end components and by means of which the end components can be screwed to the housings. However, many other methods or mechanisms are known to the person skilled in the art for connecting end components to one or more housings. In particular, in addition to the processes described above, the inventive concept also includes form-fitting and/or positive-bonding processes. In a further embodiment of the invention, the end components can exhibit plug and/or clamp connectors for wirelessly connecting and transmitting electrical power and communication signals to and from the first and second circuit boards arranged in the housing.

For further thermal regulation, especially between individual electronic modules, thermal insulators such as insulation layers, etc. may be used so as to avoid the transfer of heat from one electronic module to another electronic module.

In a further embodiment, guide grooves and/or guide blocks are arranged on the outer sides of the housing, allowing two housings to be connected laterally by sliding these guide elements into each other in the longitudinal direction. These guide grooves and guide blocks, configured in a dovetailed manner for example, are capable of transmitting forces in a direction transverse to the longitudinal direction without any further aids. Fixation in the longitudinal direction can be effected via the above-mentioned through-holes to a suitable attachment device. Such suitable attachment devices, such as a conductor rail or a switch cabinet or similar, can in turn exhibit a guide rail counterpart, i.e. a guide block or, conversely, a guide rail, by means of which a housing can be fixed to such an attachment device.

In a further embodiment, the guide rails arranged on the outer side of the housing can exhibit an undercut which is arranged transversely to the longitudinal direction. In these, connecting elements of partially complementary configuration can be used to establish a connection between two or more housings and/or between the housing and a mounting rail. An essentially symmetrical structure is provided for the shape of the connecting elements, preferably in the form of a double-T, a double dovetail or a bone. Here the inventive concept also includes the provision of an asymmetrical shape for the connecting elements, for example to connect a housing to a mounting rail which has a guide rail that is different from the housing.

The inventive concept comprises both a single-part and a multiple-part embodiment of the connecting elements. Theoretically, therefore, any number of dividing planes can be provided in the connecting element which can be arranged parallel to each other, but also at an angle. To facilitate assembly and production, for example, the plane of symmetry of the connecting element, if present, can be defined as a dividing plane, thereby dividing the connecting element into two uniformly shaped components. To connect the individual components to form a connecting element, the person skilled in the art will easily select a suitable process which is inexpensive and enables simple assembly, for example. Possible methods for consideration include screwing, welding, soldering, positive-locking connections, etc.

The person skilled in the art is familiar with numerous methods of attaching the connecting element to the guide rail that is configured to be complementary to the connecting element. For example, attachment by form-fitting, frictional lock and/or positive-bonding is conceivable, in particular by soldering, welding, gluing, clamping, screwing, etc., for example.

In a preferred embodiment, the connecting element exhibits two external belts and a bar connecting the two belts, similar to the cross-section of a double-T support. At least one of the two belts can be connected to a guide rail of a housing or a mounting rail that is configured in complementary fashion to the belt. In the preferred embodiment, the belt connected to the guide rail has a device by means of which the belt can be tensioned against the guide rail. Among many other possibilities, the person skilled in the art could, for example, provide for the insertion of a conical screw into a threaded hole located in a slot in the belt as a solution for tensioning the belt against the guide rail.

In another preferred embodiment of the electronic module according to the invention, the connecting elements exhibit a multiple-part configuration and can be clamped. The connecting elements exhibit a shape similar to a double-T support and are divided in their plane of symmetry, which includes the longitudinal axis of the bar. The two parts are joined together, for example by means of nuts and bolts, to form a connecting element. Each belt of the double-T-shaped connecting element has two ends that can be arranged in the guide rails of two electronic modules. A clamping mechanism clamps the belt ends of the connecting element against the guide rail, thereby preventing the connecting elements from falling out of the rail. The person skilled in the art is familiar with many embodiments of such a clamping mechanism. Alternatively, the clamping mechanism preferably exhibits a U-shaped, rotatable adjustment bracket which is mounted with its bar in boreholes in the belts of the connecting element so as to be rotatable. The flanges of the U-support rest against the outer sides of the belts of the connecting element and are shaped in such a way that they exert a force on the belts which depends on their rotational position. This force deflects the belts and tightens them against the guide rails.

In addition or alternatively, the connecting elements can be clamped relative to the guide rails in the longitudinal direction and transversely to the longitudinal direction by clamp elements that can be pushed into the guide rails in the longitudinal direction. In an exemplary embodiment, the connecting elements are not completely complementary to the guide rail. After insertion into the guide rail, the connecting elements can enclose a cavity with the guide rail in such a way that at least one clamp element can be inserted in the longitudinal direction in such a way that a tightening force is generated between the connecting element and the guide rail.

All in all, according to the invention, an electronic module can therefore be constructed in the longitudinal direction as well as in directions transverse to the longitudinal direction, depending on the application, by means of the through-holes and the guide elements attached to the outer circumference. In a special case, a string-like modular electronic module can be formed which can be additionally extended in a "honeycomb" manner in directions transverse to the longitudinal direction. In a further special case, an electronic assembly according to the invention is only extended in directions transverse to the longitudinal direction mainly in a planar manner, and can be extended at specific points in the longitudinal direction.

In the case of electronic modules according to the invention assembled in a linear-like manner in the longitudinal direction, the plug and clamp connectors arranged on the second circuit boards can pass on the electrical power and communication signals between the individual electronic modules according to the invention in the longitudinal direction, thereby providing a suitable electrical and communicative connection between the individual electronic components, whereby the functional electronic components are preferably arranged on the first circuit boards. It is readily comprehensible, at least for the person skilled in the art, that this is not mandatory.

In the case of a honeycomb-like assembly of electronic modules according to the invention, such a power transfer and/or communication connection can be provided by means of jumpers between two adjacent electronic modules, for example. However, it is also conceivable here that the plug and clamp connectors are routed out to an outer side of the housing according to the invention so that such a power and/or communication connection is also made possible here via a simple plug connection between the individual electronic modules. Here too, a wireless connection between the respective communication circuit boards, i.e. the second circuit boards, is preferred in order to avoid the effort involved of providing electrical and/or electromagnetic shielding when using cables.

In a further embodiment, several domes and/or cooling fins are formed inside the housing wall in such a way that at least one metallic plate can be arranged on it in a thermally conductive manner essentially transversely to the longitudinal direction. This metallic plate can be used, for example, to dissipate the heat from electronic components which are arranged in a thermally conductive and electrically insulated manner on the metallic plate. In this way, it is possible for the heat generated by heat sources which are located inside the housing and which have no direct contact with the housing wall to be dissipated via the metallic plate to the housing wall, where it is then released into the environment. As an alternative or in addition to the use explained above, the at least one metallic plate can be used, for example, to support mechanical assemblies, for example rotary bearings, against the housing or against the domes and/or cooling fins on which the metallic plate is arranged. The inventive concept also covers possible applications of a metallic plate in a housing known which are known to the person skilled in the art and not described here, such as the provision of an electrical (earth) connection to the housing.

The person skilled in the art will find a variety of solutions to attach at least one metallic plate to the (slotted) domes and/or cooling fins. Here, both thermally and/or electrically conductive connections as well as thermally and/or electrically non-conductive connections are covered by the inventive concept. For example, the metallic plate can be attached by means of screws which are turned in threads arranged in the potentially slotted domes, or by means of adhesive bonding, welding, or clamping.

In another embodiment, two metallic plates can be used to fix at least one accumulator or accumulator pack in the housing. For this purpose, the two metal plates are fixed longitudinally to spaced domes and/or cooling fins in such a way that they enclose the battery pack(s) to be fixed inside the housing wall between the two plates. The at least one enclosed battery pack may be fixed, for example, in that it exhibits a small longitudinal oversize as compared to the longitudinal distance between the two metallic plates, and is then held in position by the pre-tensioning force generated when the metallic plates are fixed to the domes and/or cooling fins.

In a further configuration of this embodiment, the accumulator packs clamped by metallic plates can also be fixed in the housing transversely to the longitudinal direction by means of aids. These aids can, for example, prevent the accumulators from swelling in the longitudinal and/or transverse direction and, if necessary, can conduct the heat generated by the accumulators to the housing wall. In addition to many other possibilities, the person skilled in the art is familiar with the use of wedges, casting material or foam material for fixing the accumulators. If mechanical means are used to fix the accumulators, the inventive concept also covers the configuration of such means in such a way as to be adjustable. In this way, the contact pressure on the accumulators can be precisely adjusted during initial assembly and can also be readjusted repeatedly during operation. In an exemplary embodiment of the invention, adjustment screws can be provided which are supported on the metallic plates and provide a clamping force on the accumulators which grows as the screw-in depth increases.

In an exemplary embodiment of the invention, several electronic modules containing accumulator packs are connected in series via the plug and/or clamp connectors on second circuit boards, thereby forming an accumulator electronic module assembly. The total voltage which can be provided by the accumulator electronic module assembly is equal to the sum of the voltages of the individual electronic modules when connected in series. By connecting several electronic modules in series, any desired voltage can therefore be achieved.

In order to increase safety when handling such an accumulator electronic module assembly or other electronic module assemblies containing high voltage and/or electronic components carrying electric currents, additional design measures may be provided to prevent injury to users of such an electronic module assembly. For example, when dismantling such an assembled electronic module assembly, care must be taken to ensure that no voltage is present at the touchable plug and/or clamp connectors that can transmit electrical power from the electronic module assembly to the outside in a way that is dangerous to the user.

One possible solution to avoid dangerous voltages at non-touch-safe plug and/or clamp connectors is to disconnect the series connection of several energy storage devices in an electronic module assembly at a non-critical location in the first step of dismantling so that the series connection is interrupted after disconnection. In order to specify the sequence of assembly and/or disconnection, the electronic module according to the invention may be fitted with a safety mechanism that specifies the sequence of assembly and/or dismantling. The inventive concept includes securing a connection both in the longitudinal direction and the transverse direction by means of such a safety mechanism. Numerous solutions for this are known to the person skilled in the art, for example the addition of clamp elements which can only be released in a certain order.

A preferred means of specifying the assembly and dismantling sequence of several longitudinally arranged modules is to use screws which are covered over by the next longitudinally arranged module. In this way, only the outermost module in the longitudinal direction can be screwed to the module adjacent to it, the other screw connections between modules being concealed. In this embodiment of the invention, a series connection of an accumulator electronic module assembly can be configured in this way. When the longitudinally outermost module is removed, the series connection between the modules is preferably interrupted and there is no longer any voltage dangerous to the user at the terminals of the dismantled electronic module and/or the remaining electronic module(s).

As a further possibility to enable a safe handling of the electronic modules, an exemplary embodiment of the invention provides for protection of the non-touch-safe live connectors from contact by means of a sliding cover plate. The cover plate is positioned over the plug by a preferably mechanical restoring mechanism. If the electronic module exhibiting the mechanical restoring mechanism is placed directly in the longitudinal direction behind another electronic module and contact with the live elements is no longer possible, a force is generated which counteracts the restoring mechanism and displaces the cover in such a way that the connectors of one electronic module can contact the connectors of the other electronic module.

Furthermore, another exemplary embodiment of the invention provides for the arrangement of the live, non-touch-safe connector on a sliding circuit board, whereby a restoring mechanism is provided on the sliding circuit board. This mechanism only establishes a conductive connection between the non-touch-safe connectors and other electrical components if the electronic module in which the non-touch-safe connector is arranged is positioned in a longitudinal direction behind another electronic module in such a way that touching the connector is no longer possible.

In some applications, e.g. for the use of electronic modules according to the invention in the conversion of renewable energies, the individual electronic modules can be arranged for example in the longitudinal direction of a mechanical drivetrain in such a way that a lateral installation space can be kept to a small size, for example. It is also conceivable that generator components such as a stator assembly and a rotor assembly can be mounted inside an electronic module according to the invention. The rotor shaft of the rotor assembly can, for example, be mounted in rotary bearings which are inserted in metallic plates. For a person skilled in the art, however, other ways of supporting the rotary shaft are also conceivable, such as the insertion of the rotary bearings in a housing cover. The inventive concept also covers the rotor of the electric machine being composed of several rotor subassemblies. In the same way, the invention also provides for the construction of the stator from several stator subassemblies.

In an embodiment of an electronic module according to the invention with an electric machine, one end of the rotor shaft or an adapter piece extending the rotor shaft may protrude from the end face of the housing. This makes it possible to connect the rotor shaft of the electronic module to another mechanical assembly. For the purpose of the invention, other mechanical assemblies are understood to mean both other mechanical assemblies which are arranged in further electronic modules, such as gear units mounted in an electronic module, and also other mechanical assemblies which are not part of a further electronic module, such as an adapter device for a wind turbine for driving the electric machine.

The person skilled in the art is familiar with various ways to fix a stator assembly in the housing of an electronic module, for example screwing or bonding, etc. According to the invention, however, one preferred method is to thermally press the stator assembly into the housing. For this purpose, the housing of the electronic module is preheated, whereby the interior of the housing is enlarged as a result of the thermal expansion of the housing material. After subsequent insertion of the stator assembly into the housing interior, the housing interior is reduced in size again during the subsequent cooling process, thereby generating an inward force on the stator assembly that is distributed over the circumference of the housing and increases as cooling progresses.

In the case of an electronic module according to the invention with an electric machine, either the rotor shaft or an extension shaft connected to the rotor shaft in a rotationally fixed manner can protrude with a first end beyond an end face of the housing, whereby numerous possibilities are known to the person skilled in the art for producing a rotationally fixed connection between two shafts, for example flange or splined shaft connections. For example, a drive torque or output torque can be transmitted via the protruding first end of the shaft, or the first end of the rotor shaft can be in rotationally fixed engagement with the second end of the rotor shaft of another electronic module arranged coaxially in the longitudinal direction.

In order to transmit or further convert the electrical energy obtained from an electronic module with an electric machine, it may be necessary to connect a second electronic module which exhibits first and/or second circuit boards to the first electronic module exhibiting an electric machine via second circuit boards, thereby constructing an electronic module assembly. If a rotor shaft protrudes from the first module, the first electronic module is arranged in such a way that the protruding end of the rotor shaft is facing away from the second electronic module. The two electronic modules can be connected to each other wirelessly by means of second circuit boards using plug and/or clamp connectors. In this way, power and/or communication signals from the motor assembly can be transmitted to the electronic components on the first circuit board of the second electronic module.

In a further embodiment of the invention, the protruding end of the rotor shaft of a first electronic module may be in rotationally fixed engagement with the rotor shaft of another electronic module. The axial position of the rotor shafts can be determined by positioning the housings relative to one another, for example, whereby the rotor shafts can be fixed in the respective housings by means of bearings. This makes it possible to connect several electronic modules with electric machines in series, for example to increase the electrical power that is available at the same rotational speed of the rotor shaft.

It is also conceivable in a further variant according to the invention to extend an electronic module assembly, consisting of at least one electronic module with an electric machine and another electronic module with electric components, by adding further electronic modules which contain the electronic components. In this way, a rectifier electronic module can be added to a generator electronic module, for example, and an accumulator electronic module can also be added. The alternating current produced in the generator could thus first be rectified and then stored in the accumulators. The person skilled in the art recognizes here that numerous combinations and sequences of electronic modules arranged in series are possible, all of which are covered by the inventive concept.

In an electronic module assembly it may occasionally be preferable to transmit power and/or communication signals between the rotor assemblies, rotor subassemblies, stator assemblies and/or stator subassemblies and the first circuit boards or electronic components by means of cables. This may be the case especially in long electronic module assemblies with numerous electric machines and numerous associated converter electronic systems, as the power and communication signals may then be too numerous for them all to be transported via a second circuit board.

Furthermore, the electrical energy generated in an electronic module with an electric machine can be transmitted via a first and a second circuit board to additional electronic modules according to the invention by means of the plug and/or clamp connectors. In such an additional electronic module according to the invention, downstream of the generator, the electrical energy generated as direct current can, for example, be converted in its voltage level and current intensity by means of a DC/DC converter and/or converted into alternating current by means of a DC/AC converter. The person skilled in the art recognizes here that a combination or sequence of different converters is covered by the inventive concept.

The electronic module described above with a generator mounted therein acts, for example, as a closing element which can be arranged in the longitudinal direction of an electronic module string. Such a closing element can of course be designed as a simple cover which preferably seals one end face of an electronic module according to the invention in a dust-tight and/or fluid-tight manner. Closing elements which simultaneously close several electronic modules according to the inventive concept arranged side-by-side are also covered by the inventive concept, such as the rear wall of a switch cabinet.

BRIEF DESCRIPTION OF THE DRAWINGS

The following figures show exemplary embodiments of the electronic module according to the invention which, however, only serve to illustrate the inventive concept. The exemplary embodiments shown in the figures do not limit the scope of protection of the present invention. Modifications or alterations to the embodiments described above in general and below as examples which are evident to a person skilled in the art are therefore also covered by the scope of protection of the invention. The following are shown:

FIG. 2 shows a second exemplary embodiment of an electronic module according to the invention with a housing in open view and a safety mechanism;

FIG. 3 shows a sectional view of an electronic module according to the invention in a second embodiment;

Figure 1:
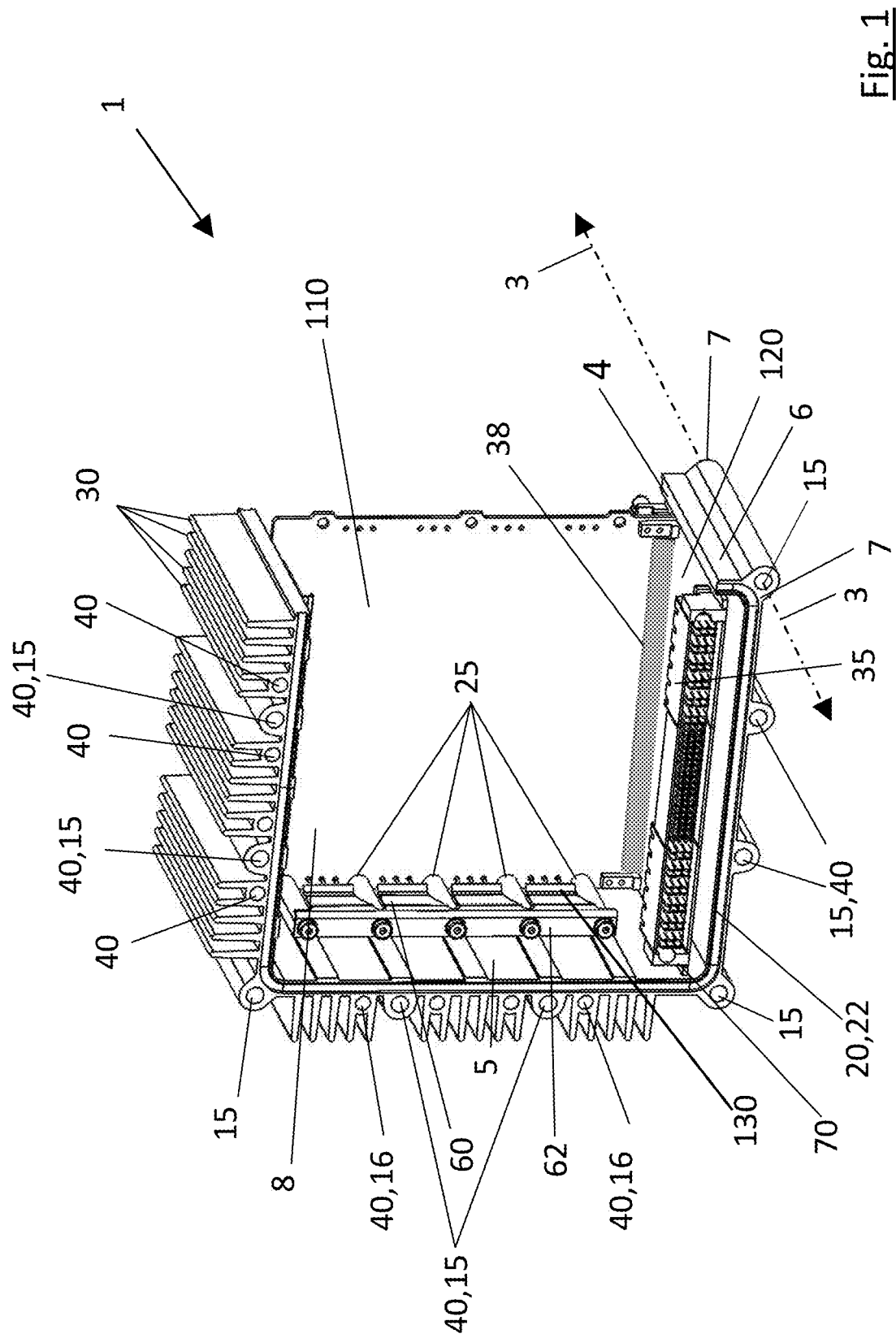
FIG. 1 shows a first exemplary embodiment of an electronic module according to the invention with a housing in open view.

The exemplary embodiments shown in the figures are explained in detail below, whereby the reference numerals are retained for identical or similar components with the same effect.

DETAILED DESCRIPTION

FIG. 1 shows an electronic module 1 according to the invention with a housing 2, which is shown with a side area in open view. It can be seen here that a housing wall 4 is bounded by an end face 7 in a longitudinal direction 3, with each end face 7 surrounding an opening 8. As shown in FIG. 1, at least one first circuit board 110 can be inserted into the housing 2 transversely to the longitudinal direction 3 via the openings 8. Parallel to the longitudinal direction 3, at least one second circuit board 120 can be inserted into retaining grooves 70 (see also FIG. 2). The two circuit boards 110 and 120 are connected to each other by means of a plug connection 38 inside the housing 2 for the transmission of electrical power and communication signals. In the longitudinal direction 3, the position of the first circuit board 110 is determined by domes 25, to which the circuit board 110 can be screwed, for example. In this way, the position of the second circuit board 120 in the longitudinal direction is also fixed, as it is connected to the first circuit board 110 via plug connector or clamp connector 38. On the second circuit board 120, further plug and/or clamp connectors 35 are arranged by means of which a wireless connection to an adjacent electronic module 1 according to the invention can be established. Depending on the application for the electronic modules according to the invention 1, both the at least one first circuit board 110 and the at least one second circuit board 120 can be fitted as required with further electronic components 100 such as semiconductor modules, resistors, capacitors, frequency converters, voltage converters, etc. as required for the respective application.

Via the plug connection 38 between the first circuit board 110, which is generally the circuit board on which the functional electronics are arranged, and the second circuit board 120, which is generally the connection circuit board for transmitting electrical power and communication signals, complex connection of shields for the electrical lines as required when using cable connections is not necessary, since such shields can be integrated in the structure of the circuit boards as is reflected in common practice in the field. The same applies to the connection of adjacent electronic modules 1 according to the invention for the plug and/or clamp connectors 35 arranged on the second circuit board 120, which therefore allow the electronic modules 1 to be plugged together easily.

On the left-hand inner side of the housing 5 in FIG. 1, a number of domes 25 can be seen by means of which the functional circuit board, i.e. the first circuit board 110, is locked in its position in longitudinal direction 3. In order to vary the position of the first circuit board 110, the length or height of the domes 25 can be suitably adjusted in the longitudinal direction 3, for example by a machining and/or other material-removing process. In addition, the domes 25 can also be machined from the other side—as shown in FIG. 1—and their length can be adjusted so that, for example, a terminal strip 62 for fixing electronic components 130 can be attached to it (for details, see FIG. 6 with the relevant description).

FIG. 2 shows a sectional view of another exemplary embodiment of an electronic module 1 with a housing 2, with cooling fins 30 arranged on the housing outer side 6. In this exemplary embodiment of the electronic module 1, slots 26 or retaining grooves 70 are arranged on the domes 25, which are located on the housing inner side 5. These can be used to mount first and/or second circuit boards 110, 120 in the longitudinal direction 3. Clamp and/or plug connectors 35 are provided on the circuit boards 110, 120 arranged in longitudinal direction 3 which enable the establishment of an electrical connection between several circuit boards 110, 120 arranged in series in the longitudinal direction 3 and to circuit boards 110, 120 arranged transversely to the longitudinal direction 3 and/or between circuit boards 110, 120 of further electronic modules 1 arranged in the longitudinal direction 3.

An exemplary embodiment of a safety device 12 is arranged in the lower part of the housing 2. The second circuit board 120 in the electronic module 1 illustrated is arranged so that it can move in the longitudinal direction 3. In an initial position, the second circuit board 120 rests against a stop 14 and is displaced towards the outside of the housing. A tension spring 13 holds the circuit board 120 in this position and is, for example, relaxed in this position, whereby a plug connection 38 between the movable second circuit board 120 and a first circuit board 110, for example, which is fixed to the housing and arranged transversely to the longitudinal direction, is not established. The plug connector 35 arranged in the longitudinal direction for the external power and communication connection of the electronic module 1 protrudes beyond the end face 7 of the electronic module 1 in the starting position shown.

If the electronic module 1 just described is connected to another electronic module 1 or an electronic module assembly with the end face 7 on which the plug connector 35 protrudes, the circuit board 120 is moved towards the inside of the housing and establishes a conductive connection between the circuit board 120 and the circuit board 110 via a conductive connection 38 to the complementary socket 39. At the same time, an electrical connection is established via the plug connector 35 with the adjacent electronic module 1. The socket 39, for example, is arranged on a first circuit board 110 which is fixed to the housing. As soon as the plug connector 38 and the socket 39 touch, the spring 13 is tensioned and exerts a restoring force on the movable circuit board 120. This creates a conductive connection between the first circuit board 110 arranged in the first housing 2 and the second circuit board 120 arranged in the second housing 2, which in this case is movable.

If the two housings 2 are separated from each other, the restoring force of the tensioned spring 13 pulls the circuit board 120 towards the outside of the housing again, thereby interrupting the electronic connection between the plug connection 38 on the second circuit board 120 and the socket 39 on circuit board 110. The plug connector 35 protruding from the first housing 2 is then free of voltage and can be safely touched by an installer.

In the exemplary embodiments shown in FIGS. 1 and 2, for example, the domes 25 are threaded after previously being adjusted in length so that a terminal strip 62 can be attached to/against the domes 25 by means of screws in the longitudinal direction 3, in a similar way to the exemplary embodiment in FIG. 1. Clips 60 are fixed in the spaces between the domes 25 via the terminal strip 62 in such a way that the clip 60 can press electronic components 130 against the inner side 5 of the housing wall 4. Cooling fins 30 are provided on the corresponding outer side 6 of the housing wall 4 in order to dissipate the heat generated during operation of the electronic components 130 and to release it to the environment.

In the exemplary embodiment in FIG. 1, liquid channels 40 are additionally arranged on the outer side 6 of the housing wall 4 in the area of the electronic components 130, which are at least partially integrated in the cooling fins 30, thereby reinforcing the cooling capacity of the cooling fins 30 and the housing 2. Furthermore, through-holes 15 are arranged between the cooling fins 30 which can be used to connect several electronic modules 1 according to the invention. These through-holes 15 can also be used as liquid channels 40. It is therefore up to the user of the electronic module according to the invention whether the through-holes 15 are to be used to connect two or more housings 2 or whether they are to be used as liquid channels 40 to convey coolant along the housing wall 4. FIG. 1 shows additional liquid channels 40 on other sides of the housing wall 4 for the transfer of coolant, which can be used to configure cooling circuits with varying temperatures or counterflow, for example.

In the exemplary embodiment in FIG. 2, for reasons of clarity, no clips 60 or terminal strips 62 are attached to the domes 25, which are provided with slots 26. Nevertheless, it still falls within the skill of the art to attach clips 60 or terminal strips 62 to these slotted domes 25, for example by inserting a screw into a thread in the dome 25.

The electronic modules 1 shown in FIGS. 1 and 2 show another special feature in the lower area. No cooling fins are arranged there, which means that this lateral installation space of the electronic module according to the invention can be kept small and/or a support surface can be provided. This applies in general to all housings 2 according to the invention, since temperature-sensitive electronic systems need not be arranged on all side surfaces, especially not on side surfaces adjacent to the second circuit board 120, which means that cooling fins and/or cooling channels are not required. Instead of this, guide rails 50 and/or guide blocks 55 can also be arranged on these side surfaces, for example, to enable lateral connection of two housings 2 of the electronic modules 1 according to the invention. Further plug and/or clamp connectors 35 for the transmission of electrical power and communication signals between laterally adjacent electronic modules 1 according to the invention can also be arranged on these outer sides free of cooling fins, for example.

For the connection of two housings 2 of electronic modules 1 according to the invention, e.g. via the through-holes 15, sealing surfaces 22 or sealing contours 20 can be arranged at the end faces 7 for the sealing of two housings 2, so that a dust-tight and/or water-tight connection of two housings 2 connected in the longitudinal direction 3 can be provided. In such a sealing contour 20, for example, a ring seal can be inserted which interacts with a sealing contour 20 of another housing 2. Such a seal between two components via a sealing surface 22 or a sealing contour 20 is familiar to the person skilled in the art, so all standard variations for achieving a dust-tight and/or liquid-tight seal are covered by the inventive concept.

FIG. 3 shows a sectional view of a further exemplary embodiment of the electronic module 1 according to the invention. The housing 2 is limited in its height or length in longitudinal direction 3 by an end surface 7. The end faces 7 have openings 8 through which the housing 2 can be fitted with electronic components 100. In the electronic module 1 according to the invention shown in FIG. 3, illustrated in sectional view in longitudinal direction 3, three first circuit boards 110 are arranged parallel to each other and connected to a second circuit board 120, preferably via plug connections 38. Electrical power and/or communication signals can be transmitted or exchanged between the first circuit boards 110 (functional circuit boards) and the second circuit board 120 (connection circuit board) via these plug connections 38.

The parallel arrangement of several first circuit boards 110 shown in FIG. 3 is made possible, for example, by adapting the domes 25 on one side at different heights in longitudinal direction 3 in such a way that recesses 28 in the circuit boards 110 allow the circuit boards 110 to be pushed past the domes 25 which are provided for the attachment of another first circuit board 110. This is illustrated in FIG. 2 with the pairs of domes 25 of different heights. A person skilled in the art recognizes that the lateral arrangement of the domes 25 can also be selected differently so that the individual screw-on points for each individual first circuit board 110 are further apart, for example. FIG. 3 also shows that the domes 25 are unmachined on the sides (here the underside) to which no first circuit board 110 is attached, and therefore end at the corresponding end face 7. This is due to the fact that the housing 2 is preferably manufactured in an endless extrusion or continuous casting process and is divided into sections on a modular basis.

Furthermore, the housing 2 shown in FIG. 3 corresponds to the housings 2 shown in FIGS. 1 and 2, whereby cooling fins 30 can be seen on the outer sides 6 of the housing wall 4 which are provided for cooling the electronic components 100 mounted in the housing 2. The second circuit board 120 shown in FIG. 3 runs from one end face 7 to the opposite-facing end face 7 and exhibits plug and/or clamp connectors 35 at its respective ends, to which another second circuit board 120 of another electronic module 1 according to the invention can be wirelessly connected. In this exemplary embodiment, this second circuit board 120 is mounted in retaining grooves 70, which are formed in the housing 2 in the longitudinal direction 3. The person skilled in the art recognizes that these retaining grooves can also be designed as slots 26 in the domes 25.

From the exemplary embodiment shown in FIG. 3, it can also be seen that for the variable positioning of only a single first circuit board 110 in the longitudinal direction 3 inside the housing 2, for example, only suitable machining/shortening of the domes 25 is required in order for the first circuit board 110, adapted to the respective requirements, to be able to be inserted into the housing. The second circuit board 120, which is plugged into the first circuit board 110, runs from one end face 7 to the opposite end face 7 and provides plug and/or clamp connectors 35 intended for the connection of further electronic modules 1.

Figure 5:
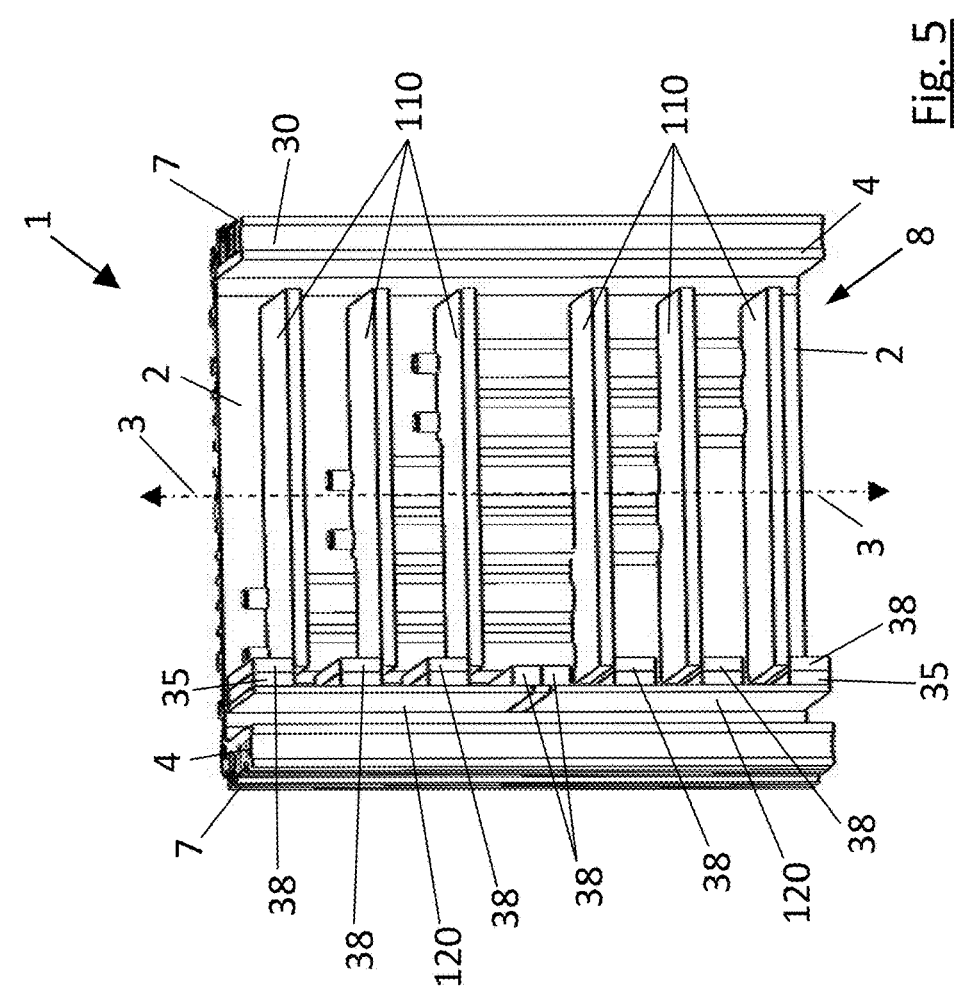
FIG. 5 shows a sectional view of the exemplary embodiment shown in FIG. 4 in an assembled state.
Figure 4:
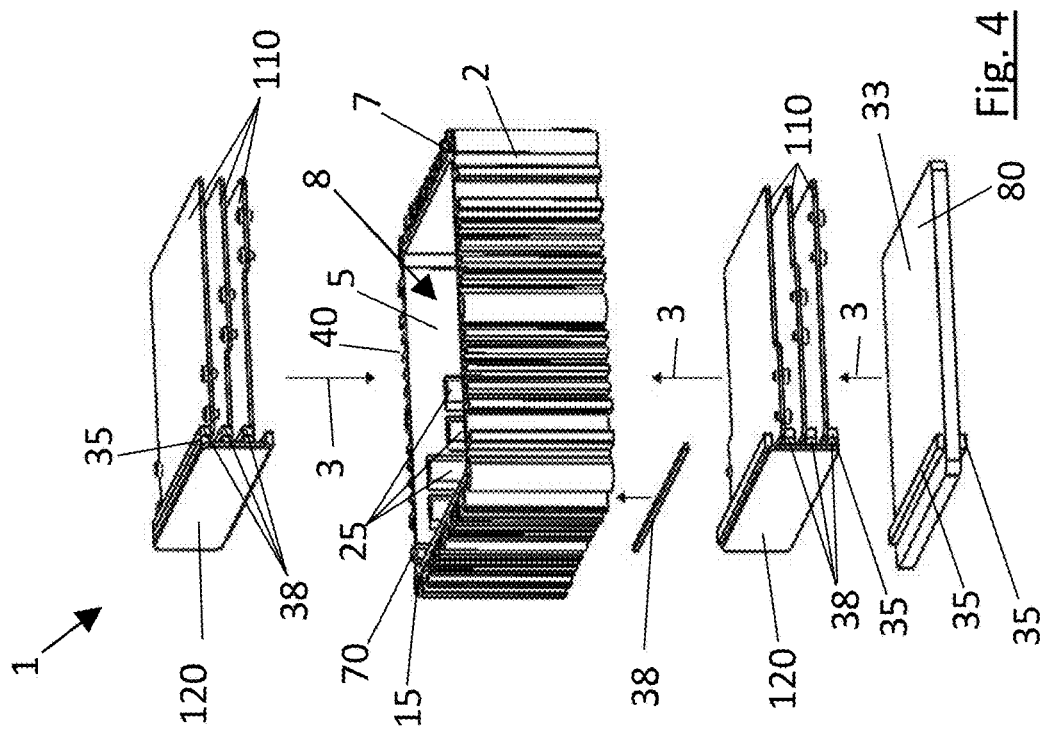
FIG. 4 shows a further embodiment of the electronic module according to the invention in a pre-assembled state.

FIG. 4 and FIG. 5 show another exemplary embodiment of the electronic module 1 according to the invention in which a large number of first circuit boards 110 are arranged parallel to each other in the housing 2. FIG. 4 shows two pre-assembly groups, each of which exhibits three first circuit boards 110 with a second circuit board 120 connected to them. The pre-assembly groups can be inserted into the housing 2 from both end faces via the respective opening 8. The assembly direction corresponds to the longitudinal direction 3, which is shown in FIG. 4 with arrows pointing towards each other. The direction of assembly also corresponds to the direction of forming or demoulding when manufacturing the housing 2. In the housing wall, next to the domes 25, a retaining groove 70 is arranged in the longitudinal direction 3 of the housing 2 into which the two second circuit boards 120 can be inserted with the first circuit boards 110 connected to them, thereby serving as guide rails for assembly. FIG. 4 shows an example of an insulation layer 33 for thermal and/or electrical and/or electromagnetic insulation of two adjacent electronic modules 1. The insulation layer 33 is shown closed in this embodiment but may also have one or more openings for the passage of electronic components, attachment elements, cooling channels, etc., as is readily comprehensible to a person skilled in the art. The insulation layer 33 shown as an example in FIG. 4 also shows plug and/or clamp connectors 35 on each side to enable the electrical connection as well as the communication connection between two adjacent electronic modules 1. In another embodiment, the insulation layer 33 can also be a metallic plate 80 to transfer heat from the electronic components 130 inside the housing 2 to the housing wall 4 and the cooling device 30 or 40.

The pre-assembled state from FIG. 4 is shown in a sectional view in FIG. 5 in the assembled state, whereby it can be seen that the two second circuit boards 120 can be connected to each other at their point of contact via a plug connection 38. The first circuit boards 110 are also connected to one of the second circuit boards 120 via plug connections 38.

FIG. 5 also clearly shows the respective adaptation of the domes 25, which are shortened in length as required so that the individual first circuit boards 110 can be mounted parallel to one another in the housing 2 of the electronic module according to the invention. In this exemplary embodiment, the domes 25 can also exhibit slots 26, analogous to the slotted domes 25 shown in FIG. 2. At the two end faces 7, plug and/or clamp connectors 35 are provided at the respective end faces 7 of the electronic module 1 via the two second circuit boards 120 for the wireless connection of further electronic modules 1. Electronic module 1 also essentially corresponds to electronic module 1, which is already shown in FIGS. 1 to 3.

Figure 6:
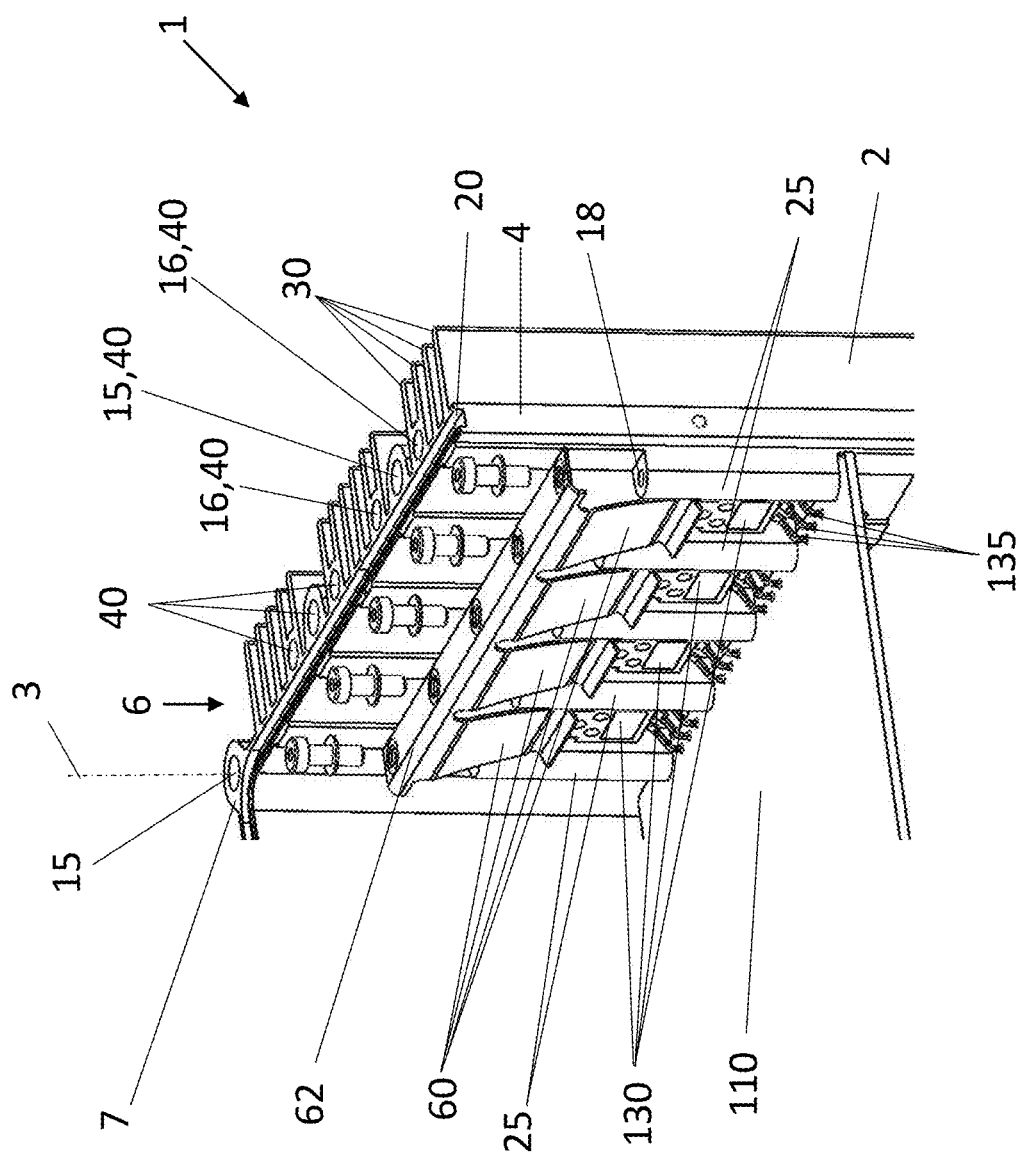
FIG. 6 shows an enlargement of a section of another exemplary embodiment of the electronic module in a pre-assembled state.

FIG. 6 shows a detail of an exemplary attachment option according to the invention for electronic components 130 that require a high cooling capacity, since such electronic components can become very hot during operation. In this exemplary case these are MOSFETs, for example, which are attached to the first circuit board 110 by their legs 135 in such a way that their housings come to rest between the domes 25. In order to enable good heat conduction to the housing wall 4 of the electronic module via the housings of the electronic components 130, clips 60 are provided which can be screwed to the domes 25, for example, and whose elastic forces act in such a way that the housings of the electronic components 130 (MOSFETs) are pressed against the inner side 5 of the housing wall 4. Here too, the person skilled in the art recognizes that an embodiment of the domes 25 with slots 26 is also possible, whereby the slots 26 can then serve as retaining grooves for circuit boards 110, 120 arranged in longitudinal direction 3.

The mounting example shown in FIG. 6 for a number of electronic components 130—MOSFETs or other semiconductor power electronic components—is designed in such a way that the clips 60 are combined to form a terminal strip 62 which can be screwed onto the respective domes 25, which in turn are adjusted accordingly in height. On the outer side 6 of the housing wall 4, which is opposite the inside wall 5 against which the electronic components 130 are pressed, cooling fins 30 are arranged for better heat dissipation and, for example, liquid channels 40 are also arranged which can be integrated into the cooling fins 30. Through-holes 15 which are also formed in this area in the longitudinal direction 3 of the housing can also be used here for the transfer of coolant.

For fluid-tight sealing between two adjacent electronic modules 1, for example, a sealing contour 20 is incorporated in the end face 7 of the housing 2 into which a ring seal can be inserted, for example. It may be preferable to likewise provide the liquid channels 40 or 15 with sealing rings or to arrange connecting nipples 43 at this point which enable sealing between the individual liquid channels 40 of two adjacent electronic modules 1 or their housing 2.

Reference numeral 18 in FIG. 6 also shows an example of a borehole for the other domes 25 which is intended to accommodate self-tapping screws, for example. However, a thread can also be inserted into this borehole 18 so that, for example, screws with a metric thread can be used. Even though the housing 2 is only shown in part in FIG. 6, it is essentially the same as the housing 2 as shown in FIG. 1.

Figure 7:
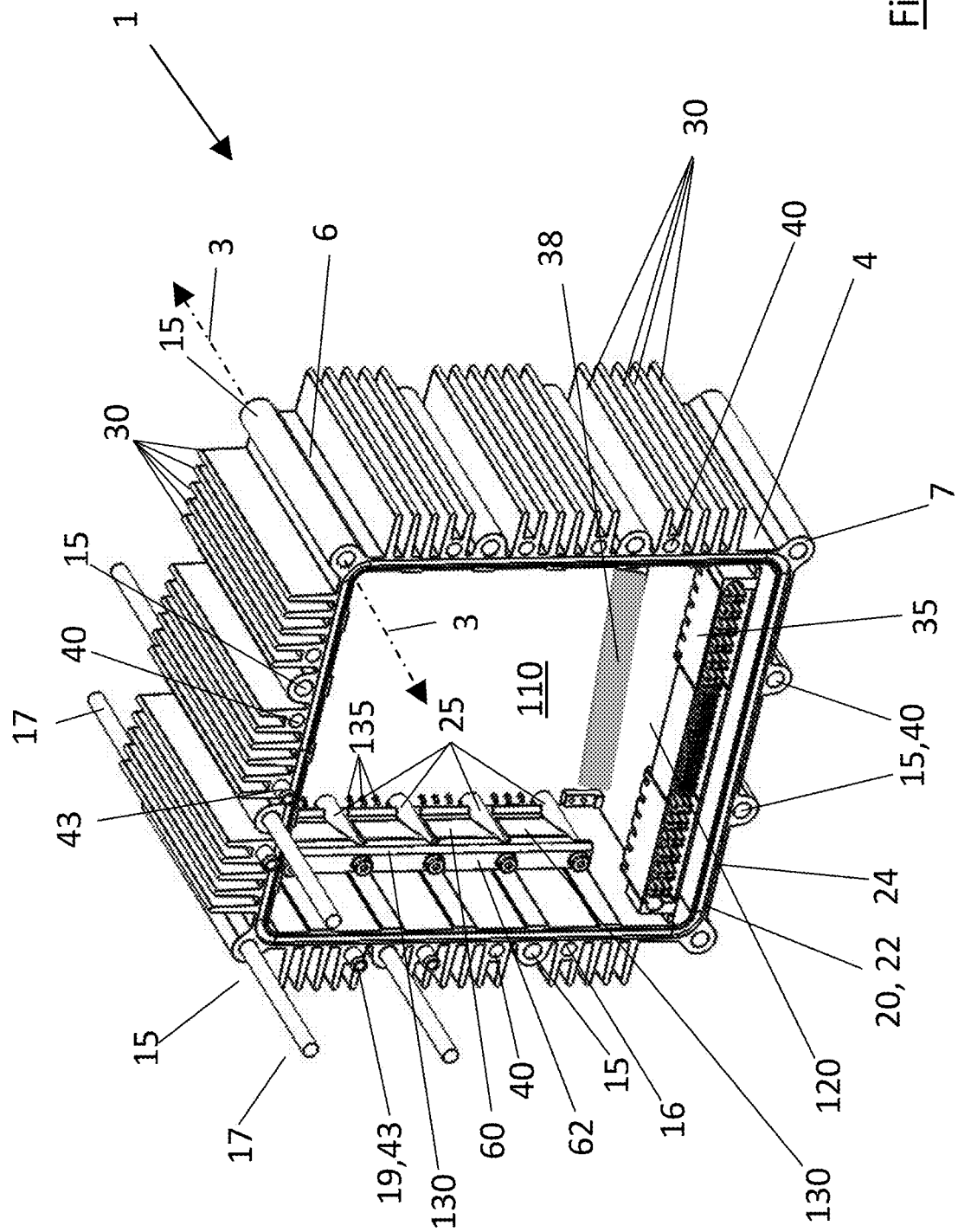
FIG. 7 shows a further example of the electronic module according to the invention in a perspective view.

FIG. 7 shows a housing 2 fitted with electronic components 100, in particular with only one first circuit board 110 and only one second circuit board 120 as well as several electronic components 130 constitutes an electronic module 1 according to the invention. On the visible end face 7 of the housing 2, a sealing ring 24 is inserted, and in some through-holes 15 threaded rods 17 are inserted in exemplary fashion into which further electronic modules 1 according to the invention can be pushed from both sides and connected to the electronic module 1 shown in FIG. 7. It can be seen that there are no limits to the number of electronic modules 1 according to the invention arranged in a line/series, since the threaded rods 17 can essentially be configured to be endless. In addition to the threaded rods 17, for example, alignment pins 19 are arranged which can be used for positioning or centring when connecting two electronic modules 1. It is readily comprehensible that such alignment pins 19 can also be arranged on the opposite-facing side of the housing wall 4 if necessary in order to achieve easy positioning and centring of the two adjacent electronic modules 1. In a preferred embodiment, these alignment pins 19 are hollow-bored and can then be used in addition to connection nipples 43 for connecting liquid channels 40, whereby fluid-tightness to the housing 2 can also be achieved by means of suitable fits—if necessary press fits.

In another embodiment, a flat seal or ring seal can be pushed over the hollow-bored alignment pins 19 or the connecting nipples 43 which can then be used for the liquid-tight connection of the liquid channels 40. Other components and parts shown in FIG. 7 as well as components of electronic module 1 according to the invention are provided with reference numerals which have already been explained in the previously described figures so as to avoid repetition. It is therefore quite conceivable that the electronic module 1 shown in FIG. 7 comprises further non-visible first circuit boards 110 which are hidden by the first circuit board 110 shown in the foreground. The same applies to the plug and/or clamp connectors 35 located on the other end face 7 on a (further) second circuit board 120, which can also be the same second circuit board 120 visible in FIG. 7. As shown in FIGS. 4 and 5, however, these can also be two separate second circuit boards 120 which can be connected at their respective connection points by means of plug connections 38.

Figure 8:
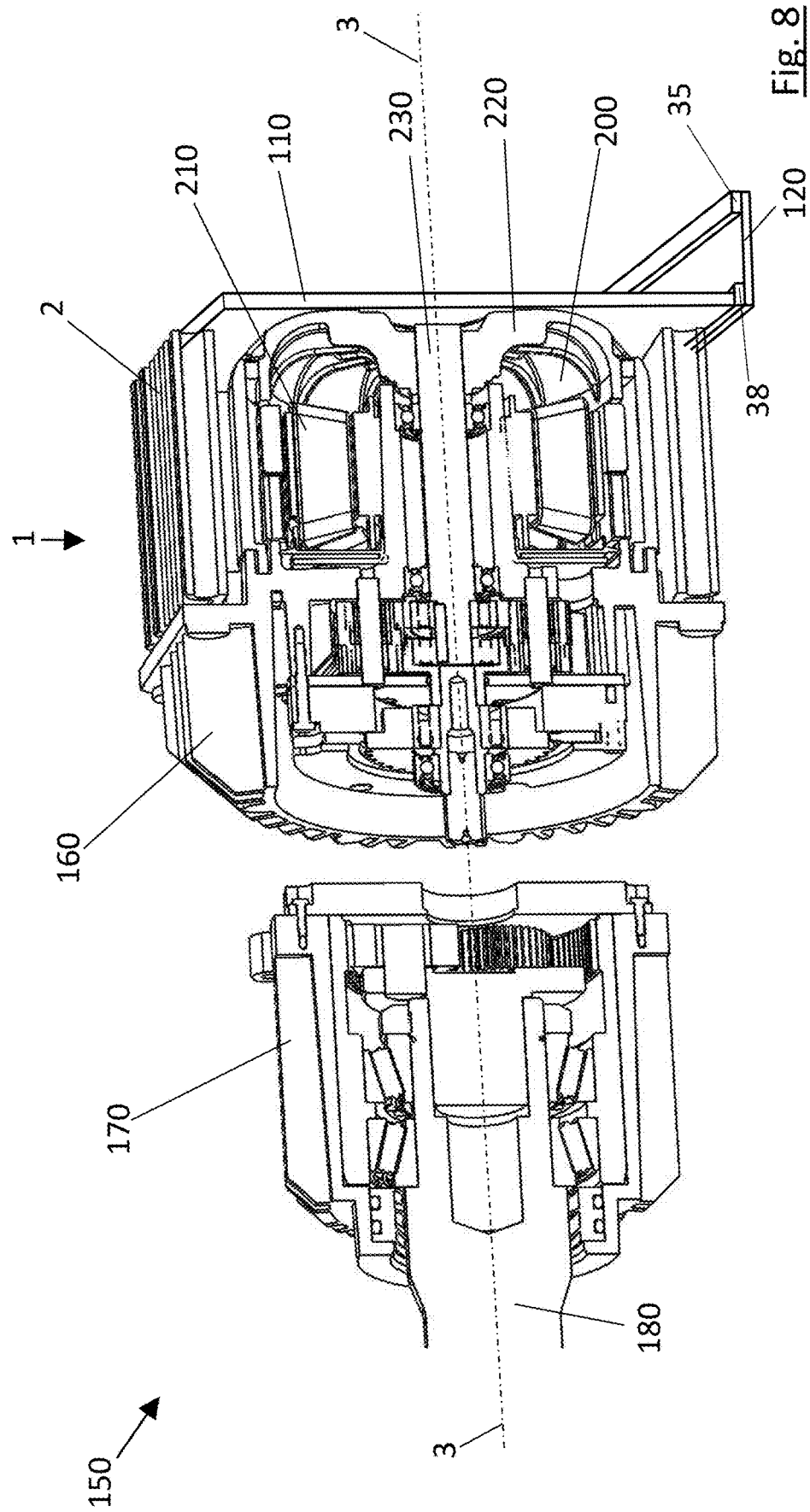
FIG. 8 shows an example of application of an electronic module according to the invention.

FIG. 8 shows a special application for an electronic module 1 according to the invention. An electrical generator 200, with a rotor 210 and a stator 220, is arranged in the housing 2, its drive shaft being aligned in the longitudinal direction 3 of the electronic module 1. The electronic module 1 according to the invention can be flanged to further components 160, 170 of a mechanical drivetrain 150 for driving the generator shaft 230. The example of a drivetrain 150 shown in FIG. 8 shows a synchronous gear 160 flanged to the electronic module housing 2 according to the invention with a planetary gear 170 arranged in front of it which can be set in rotation by a drive shaft 180. Such a drivetrain 150 for the rotary drive of the generator 200 can be used, for example, in a wave power plant in which the drive shaft 180 can be driven in both directions of rotation. The direction of rotation is unified via the synchronous gear 160, so the generator 200 is always operated in the same direction and can transmit its power to other electronic modules 1, for example via a first circuit board 110 arranged in electronic module 1 and a second circuit board 120 connected to the latter.

A similar drivetrain which can be flanged to the electronic module 1 according to the invention is conceivable for wind power plants, for example, whereby no synchronous gear is required in this case since wind turbines are only operated in one direction of rotation. However, large speed fluctuations occur in this case, so a homogenization of the energy generated can be achieved via the electronic components 100 accommodated in the flange-mounted electronic modules 1.

Figure 9:
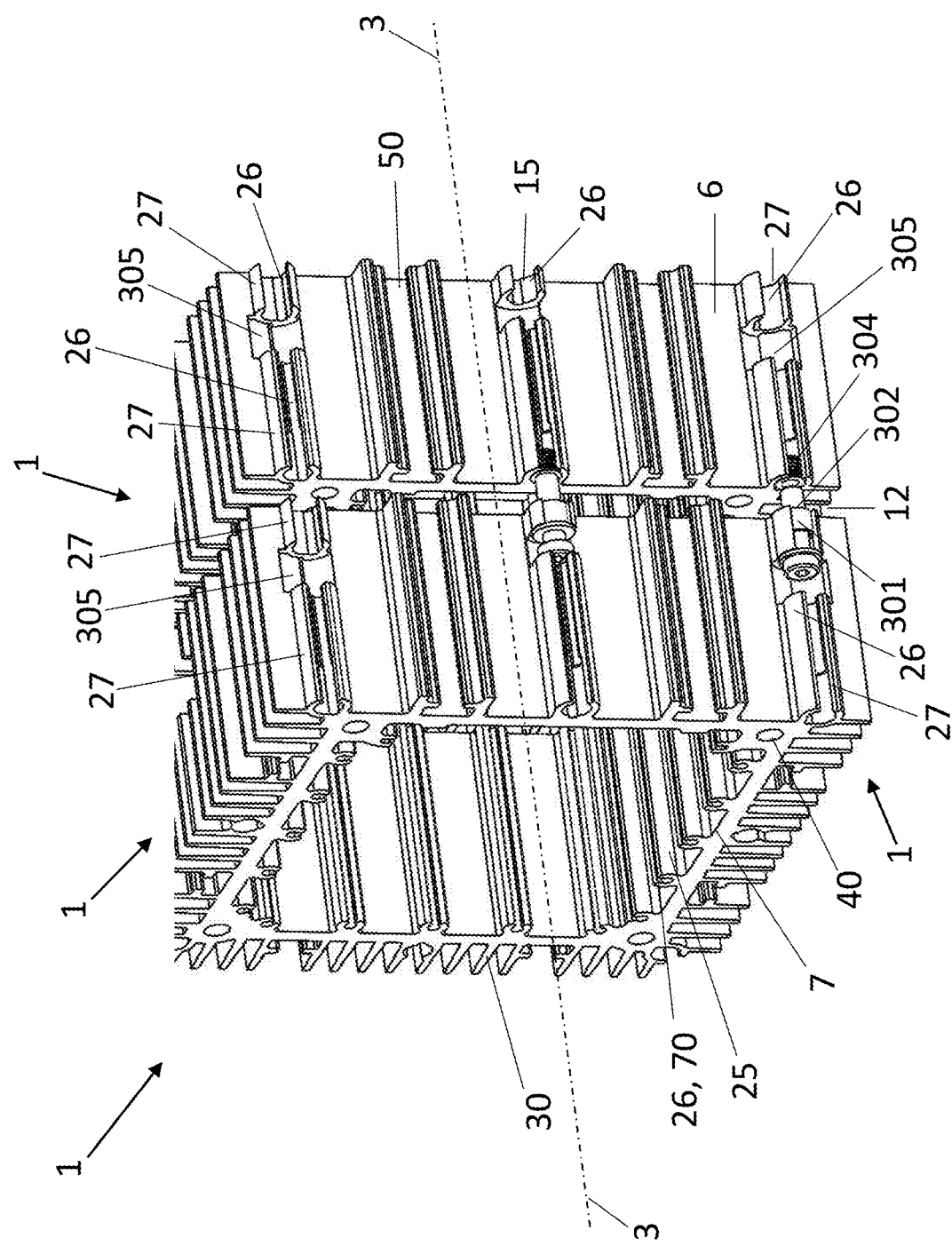
FIG. 9 shows an example of an electronic module according to the invention with a predetermined assembly/dismantling sequence.

FIG. 9 shows an exemplary embodiment of an electronic module in which the assembly and/or dismantling sequence of at least two electronic modules 1, arranged in series in longitudinal direction 3, can be specified. A slot 26 is provided in connection domes 27 on the housing outer side 6 in which the through-holes 15 are located. Part of the connecting domes 27 on the housing outer side 6, which extend in the longitudinal direction 3 over the outside of the housing 6, has been removed. At the end face 7 of the housing of the first electronic module 1 to which the next electronic module 1 is attached, threaded inserts 304 are inserted into the connection domes 27.

On the end face 7 of the electronic module 1 to be connected, screws 302 are inserted via the slots 26 in cut-outs 305 transverse to the longitudinal direction 3, whereby the heads of the screws 302 fit into the cut-out part of the connection domes 27. The screws 302 are secured against falling out by means of guide sleeves 301 which are inserted in the through-holes 15 in the longitudinal direction 3.

The screws are tightened with a screwdriver whose blade is inserted through the through-hole of the connection dome 27. It is therefore only possible to tighten the screws 302 of the respective upper module which are not covered by a superimposed module. When dismantling an electronic module assembly 300, only the screws 302 of the upper module 1 can be loosened, since the screws 302 of another electronic module 1 located behind (below) it are concealed.

In an electronic module assembly 300, power and/or communication signals are transmitted between the electronic modules 1 via the plug connections 35 between the second circuit boards 120. These can pose a safety risk to the user if touching a plug via the body closes an electric circuit or an electric arc is formed. If, however, the electric circuit is already interrupted at the correct point when the electronic module assembly 300 is opened, for example by a safety mechanism, there is no longer any risk to the human body. Such a safety mechanism 12 can be used, for example, if it is to be ensured that when disconnecting at least two electronic modules 1, the plugs 35 and/or 38 on the second circuit boards 120 of the electronic modules 1 with accessible screw heads are disconnected first, thereby ensuring that the electronic modules 1 are disconnected in a predetermined sequence.

In a further embodiment, plugs 38 are arranged on the second circuit boards 120 for transmitting power and/or communication signals inside the electronic modules 1 which only establish a conductive connection between electronic modules 1 when the modules are completely screwed together. Depending on the electronic components 100 contained in the module, an installer may be exposed to the risk of electric shock if, for example, pre-assembled electronic module assemblies 300 are combined into an electronic module string at a central position. When assembling an electronic module assembly 300 where all screws on the outer side of the housing are accessible or the electronic module assembly 300 is at least partially held together by means of threaded rods 17, this hazard cannot be completely ruled out. However, this hazard can be avoided by arranging the screws at different heights in the longitudinal direction, for example, or by concealing screws which engage in those electronic modules 1 that have to be loosened first.

In this exemplary embodiment of the safety mechanism according to FIG. 9, the removed parts of the dome 25 are not all arranged at the same height in the longitudinal direction. As a result, the heads of the screws 302 which are located in the removed parts of the connection domes 27 are arranged at different heights. When assembling the modules, it is necessary to first tighten the screws 302 whose heads 320 are located closest to the end face of the electronic module 1 before the screws 302 with heads 320 located further away from the end face can be tightened. By means of such an arrangement, an installer can be forced to always screw on electronic modules 1 completely before a new electronic module 1 can be fitted. This is because if the screws 302 of electronic module 1 are not fully tightened, the first screws 302 of the second electronic module 1 to be attached to the first electronic module 1 cannot engage in the threaded insert, for example.

Figure 10:
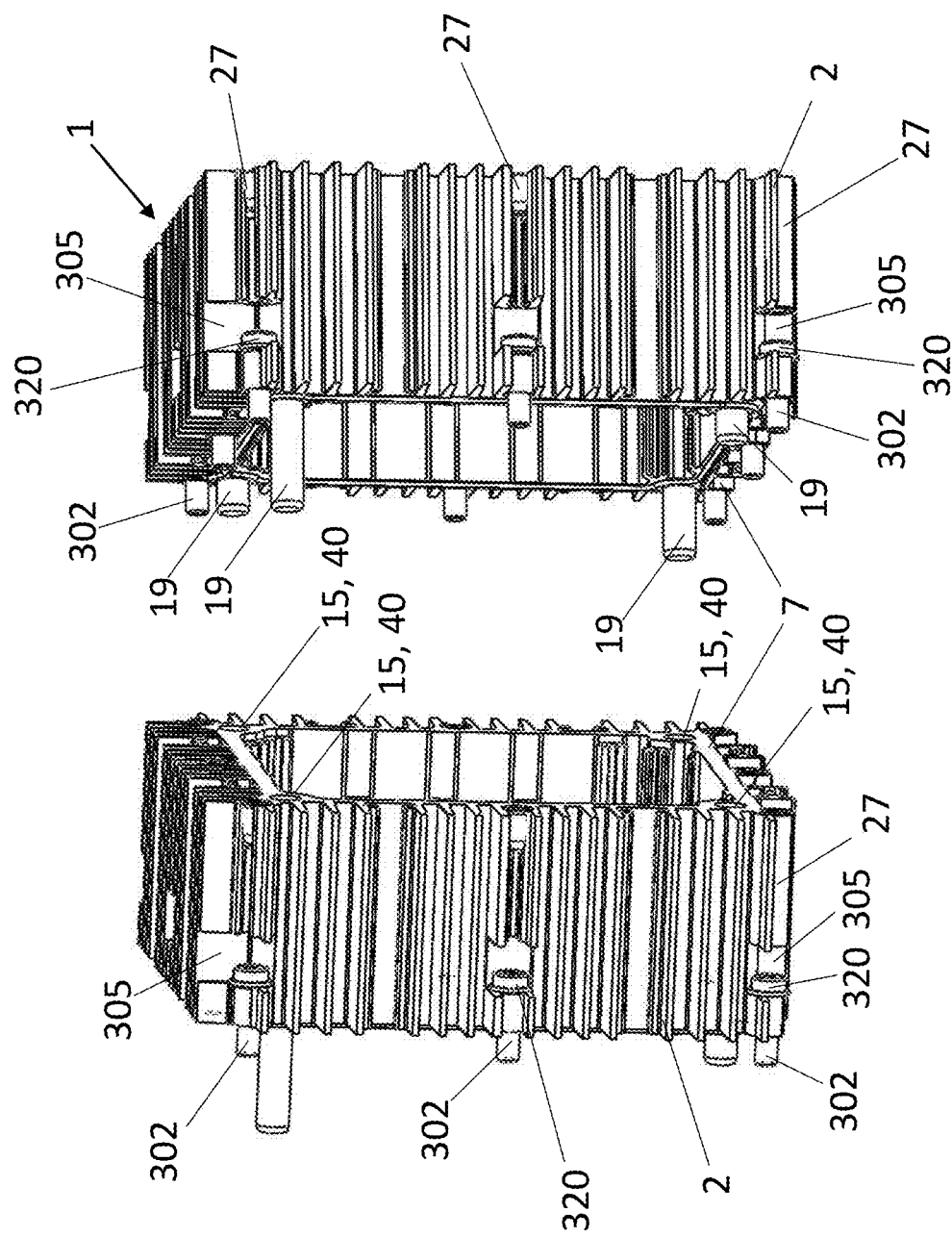
FIG. 10 shows an embodiment of an electronic module according to the invention with a combination coding.

FIG. 10 shows an example of an electronic module 1 with a combination coding which determines the possible combinations when several electronic modules 1 are strung together in the longitudinal direction 3. The housings 2 of the electronic modules 1 have through-holes 15 which extend in the longitudinal direction 3 from a first end face 7 of the housing 2 to a second end face 7 of the housing 2. In an exemplary embodiment, the through-holes 15 are formed from the first end face 7, for example by post-processing, so that alignment pins 19 are inserted into the through-holes, whereby the alignment pins 19 can exhibit different lengths and/or diameters. From the second end face 7, the through-holes 15 of the housings 2 are configured, for example by drilling out, in such a way that only those alignment pins 19 which do not exceed a certain length and/or a certain diameter can be accommodated in the through-holes 15 of the end face 7 of the second electronic module 1. Two electronic modules 1 can therefore only be combined with each other if the length and/or diameter of the alignment pins 19 are complementary to the depths and/or diameters of the post-processing of the through-holes 15 of the second electronic module 1. In a modular system of electronic modules 1, this "Lego-like" principle makes it possible to establish a coding system in which only certain housings 2 can be combined with each other, making it easier for the user to correctly put together an assembly consisting of several electronic modules 1.

Figure 11:
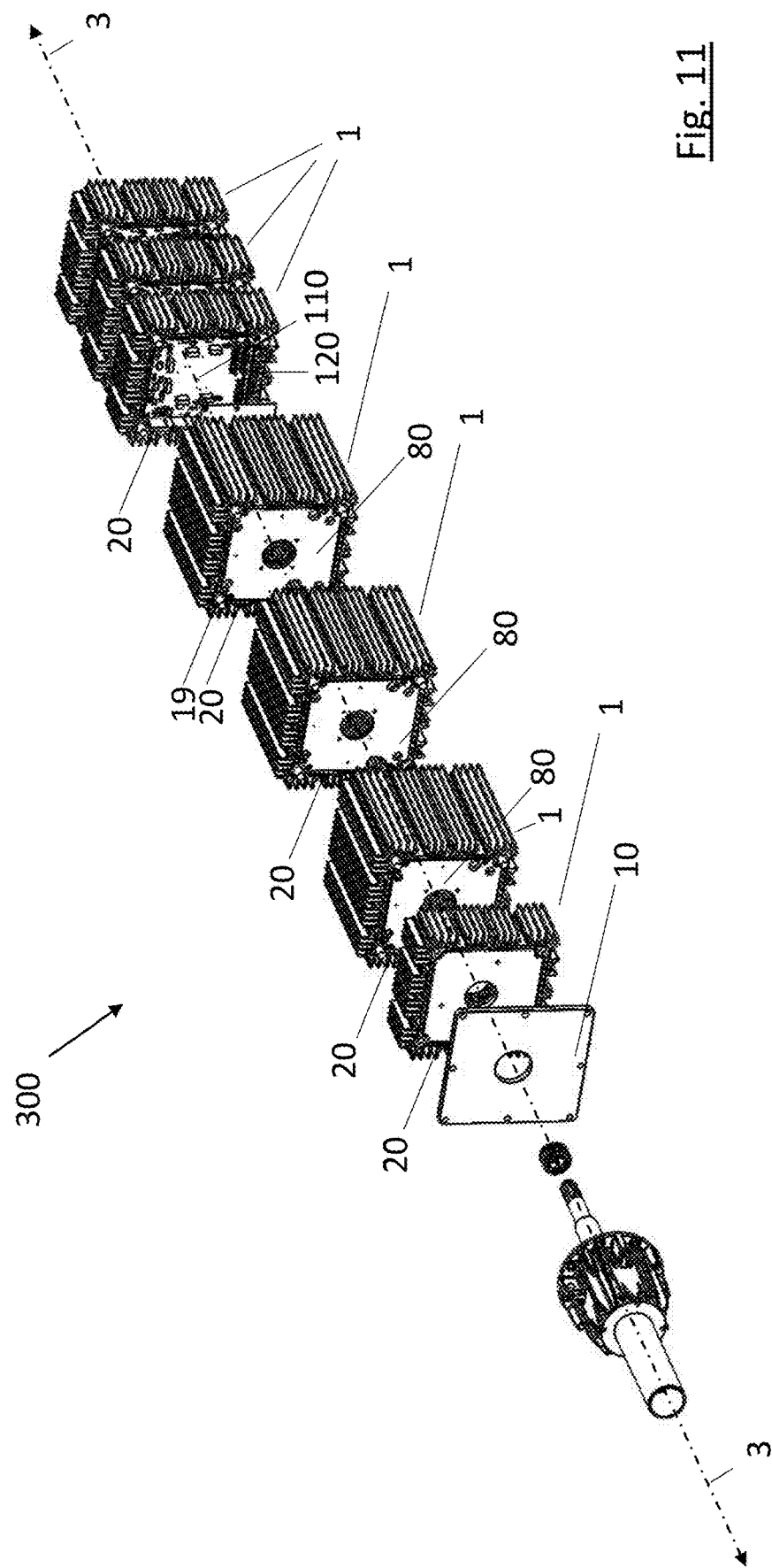
FIG. 11 shows an exemplary arrangement of several exemplary electronic modules according to the invention in a longitudinal direction.

FIG. 11 shows an exploded view of an exemplary string of several electronic modules 1 according to the invention to form an electronic module assembly 300 as could be used to convert renewable energy in wave power plants, for example. From left to right, the following are strung together: an electronic module 1 containing a mechanical bearing package, an end component 10 in the form of a plate, an electronic module 1 containing a mechanical brake, three electronic modules 1 containing electric machines 200 and three electronic modules 1 containing power electronic components and electronic components 100, such as voltage converters, MOSFETs, resistors, microcontrollers, etc. The electronic modules 1 in the exemplary embodiment are positioned relative to each other in a plane that is orthogonal to the longitudinal direction 3, for example by means of alignment pins. The shafts of the electric machines 200 are connected in a rotationally fixed manner via splined shaft connections to extension shafts which connect the electric machines mechanically to each other.

Figure 12:
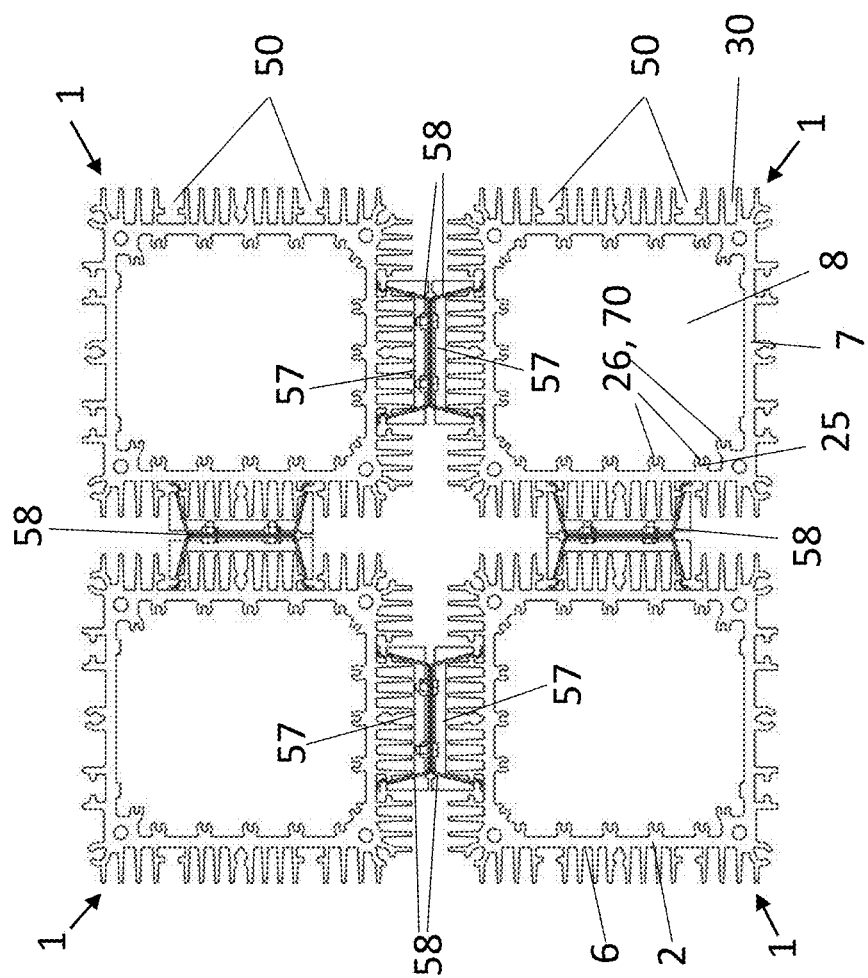
FIG. 12 shows an exemplary arrangement of several exemplary electronic modules according to the invention transverse to the longitudinal direction.

FIG. 12 shows an exemplary lateral arrangement of several electronic modules 1 according to the invention, transverse to the longitudinal direction 3. The housings 2 of the electronic modules 1 have guide rails 50 on the housing outer sides 6 which exhibit an undercut arranged transversely to the longitudinal direction 3. In these, connecting elements 58 can be inserted which are complementary to the shape of the guide rails 50. The connecting elements 58 exhibit a preferably symmetrical structure and resemble the shape of a double-T in the exemplary embodiment shown. It is covered by the inventive concept to configure the connecting elements 58 either in single parts or multiple parts, for example to facilitate the manufacture and/or assembly of the connecting elements 58. Here, the person skilled in the art is aware that there are many parallel and non-parallel dividing planes on which the preferably symmetrical connecting elements 58 can be subdivided. It also falls within the skill of the art to select a suitable method for joining split connecting elements 58.

Furthermore, it is within the scope of the inventive concept to arrange a tensioning device 59 on the connecting elements 58 by means of which the connecting elements 58 can be tensioned against the guide rail 50. For this purpose, FIG. 12 shows a rotating mechanism 57 which exerts a force on the connecting elements 58 which is adjustable by its rotational position, for example, thereby pressing the latter against the guide rail 50. It goes without saying that other tensioning devices or mechanisms which fall within the skill of the art are likewise covered by the inventive concept.

All in all, the electronic module system according to the invention allows a flexible combination of the most diverse electronic components, whereby the housings in which the electronic components and electric machines are mounted can be standardized, partially standardized or normed in such a way that the required electronic components can be assembled in a kind of modular system for every application as required, whether for renewable energies or "conventional" energies. The electronic assemblies constructed in this way can also be extended in a modular fashion to include mechanical assemblies such as brakes, gears or bearing packages. The plug connections according to the invention also avoid a great deal of manual work when connecting the individual electronic modules since shielding, such as is required for conductors carrying electrical currents—especially carrying high currents, can be integrated into the circuit boards. Such shields can usually already be incorporated in the construction of the respective circuit boards and do not have to be subsequently connected to each other during electrical connection for each cable, in a similar way to antenna cables.

The electronic module system according to the invention therefore provides a simple, inexpensive and robust system for the assembly of required power electronics or communication platforms which can be assembled in building blocks according to a modular method.

The invention claimed is:

1. Electronic module (1) for the mounting of electronic components (100), with a housing (2) which is bounded in a longitudinal direction (3) by two end faces (7), each comprising an opening (8), such that the housing (2) can be fitted via the openings (8) with at least one first circuit board (110) equipped with electronic components (100) and with at least one second circuit board (120) equipped with plug and/or clamp connectors (35), whereby the housing (2), on the inner side (5) of a housing wall (4), exhibits at least one dome (25) configured in a longitudinal direction (3) to which the at least one first circuit board (110) can be attached essentially transversely to the longitudinal direction (3), and the housing (2) further exhibits, on two opposite-facing inner sides (5) and/or two opposite-facing domes (25), a retaining groove (70) in each case for the insertion of at least one second circuit board (120) in the longitudinal direction (3), wherein the at least one first circuit board (110) and the at least one second circuit board (120) are wirelessly electrically connected to each other inside the housing (2) via plug and/or clamp connectors (35, 38) for the transmission of electrical power and communication signals, and on the at least one second circuit board (120) additional plug and/or clamp connectors (35, 38) are arranged in such a way that plug and/or clamp connectors (35, 38) of another electronic module (1) can be wirelessly connected to the at least one second circuit board (120) via plug and/or clamp connectors (38) for the transmission of electrical power and communication signals.

2. Electronic module (1) according to claim 1 which exhibits numerous retaining grooves (70) and/or slots (26) extending in an essentially longitudinal direction (3), which are arranged on pairwise opposite-facing housing inner sides (5) and/or domes (25), wherein several first circuit boards (110) and/or second circuit boards (120) are arranged in the retaining grooves (70) extending in the longitudinal direction (3) and the circuit boards (110, 120) arranged in the longitudinal direction (3) can be wirelessly connected via plug and/or clamp connectors (35, 38) to circuit boards (110/120) arranged transversely to the longitudinal direction (3).

3. Electronic module (1) according to claim 1, in which the housing (2) is made by means of casting from a metal using the extrusion, continuous casting or (pressure) casting method, preferably from aluminium or an aluminium alloy, or from a plastic by means of injection moulding or extrusion.

4. Electronic module (1) according to claim 1, in which cooling fins (30) are arranged on the housing wall (4) which extend essentially in planes parallel to the longitudinal direction, and/or fluid channels (40) are applied on the housing wall (4) in the longitudinal direction (3) which enable coolant to be passed on between the individual housings (2).

5. Electronic module (1) according to claim 4, in which the through-holes (15) and/or liquid channels (40) and/or cooling fins (30) are arranged on the inner side (5) and/or the outer side (6) of the housing wall (4) and/or on the domes (25).

6. Electronic module (1) according to claim 1, in which on at least one dome (25) at least one clip (60) can be attached in such a way, preferably screwed in the longitudinal direction (3), that the clamping force essentially acts transversely or obliquely to the longitudinal direction (3).

7. Electronic module (1) according to claim 6, in which the clip (60) and/or a terminal strip (62) comprising several clips (60) can be used to press one or several electronic components (130) requiring cooling during operation flat against the inner side (5) of the housing wall (4) in such a way as to enable direct heat dissipation from the housing of the electronic components (130) to the housing wall (4) and/or to the clip (60) and/or terminal strip (62).

8. Electronic module (1) according to claim 1, in which the housing (2) exhibits a housing wall (4) configured in a frame-like, profiled manner and closed in the circumferential direction, which is bounded in the longitudinal direction (3) by the end faces (7) in such a way that in the longitudinal direction (3) several housings (2) which are strung together essentially congruently can be connected to each other, preferably via through-holes (15) configured in the housing wall (4), wherein a circumferential sealing contour (20) or a sealing surface (22) can be configured on the end faces (7) for the fluid-tight connection of neighbouring housings (2) in the longitudinal direction by means of an O-ring seal, flat seal, foam seal or adhesive seal (24).

9. Electronic module (1) according to claim 8, in which the through-holes (15) exhibit threads by means of which, for example, end components (10) which close the housing (2) in the longitudinal direction (3) can be attached, wherein the connection between the housing (2) and the end components (10) can be configured by means of a seal (4) to be fluid-tight and the end components (10) can exhibit plug and/or clamp connectors (35) for wireless connection and transmission of electrical power and communication signals to and from the first and second circuit boards (110, 120) arranged in the housing (2).

10. Electronic module (1) according to claim 8, in which the housing wall (4) exhibits guide rails (50) or guide blocks (53) configured further in the longitudinal direction (3) and arranged on the outer side (6) in order to provide a lateral connection possibility for the housings (2) among each other, fastening of the housings (2) to a mounting rail, accommodation of the housings (2) in a switch cabinet and/or the attachment of the housings (2) to other fixtures, in particular standardized attachment devices.

11. Electronic module (1) according to claim 10, in which the guide rails (50) arranged on the outer side (6) exhibit an undercut arranged transversely to the longitudinal direction for the insertion of connecting elements (58) of partially complementary configuration by means of which two housings (2) can be fixed to each other or the housing (2) can be fixed to mounting rails or attachment devices transversely to the longitudinal direction, wherein the connecting elements (58) preferably exhibit a symmetrical structure in the shape of a double-T, a double dovetail or a bone and can be configured in multiple parts.

12. Electronic module (1) according to claim 1, whose housing (2) can be attached to the housing of a least one other electronic module (1) by means of form-fitting, frictional lock and/or positive-bonding, wherein a safety mechanism (12) is provided which determines the sequence and/or combination possibilities in which the electronic modules can be connected to each other in the longitudinal direction (3) and subsequently be disconnected from each other.

13. Electronic module according to claim 1, in which a safety device which can be shifted by means of an elastic restoring force interrupts the contacting between the non-touch-safe plug and/or clamp connectors (35) and live electronic components (100) or covers live, non-touch-safe plug and/or clamp connectors (35).

14. Electronic module (1) according to claim 4, in which between two housings (2) positioned adjacently in the longitudinal direction, a thermal insulation plate (33) can be arranged, preferably by means of the through-holes (15), wherein a seal (24) can be arranged between the thermal insulation plate (33) and the relevant end surface (7) of one of the two housings (2).

15. Electronic module (1) according to claim 1, in which several domes (25) and/or cooling fins (30) are configured on the inner sides of the housing wall (4) in such a way that at least one metallic plate (80) can be arranged essentially transversely to the longitudinal direction (3) in a thermally conductive manner so that heat dissipation is possible via the metallic plate to the housing (2), wherein on one or both sides of the at least one plate (80) first circuit boards (110) and/or electronic components (100) can be arranged to be electrically insulated so that these can be wirelessly connected to the second circuit boards (120) for the transmission of electrical power and/or communication signals.

16. Electronic module (1) according to claim 15, in which, between two metallic plates (80), one or more accumulators or one or more accumulator packs can be attached in the longitudinal direction (3) to a first circuit board (110) which electrically connects the poles of the accumulators via the two metallic plates (80) in the housing (2) and the accumulators or the accumulator packs can be fixed in the housing (2) transversely to the longitudinal direction (3) by means of a casting material, foam material or adjustable wedge devices on at least two adjacent side surfaces in such a way that a swelling of the accumulators or accumulator packs in the longitudinal direction (3) and/or transversely to the longitudinal direction (3) is essentially prevented and heat dissipation is enabled to the housing (2) via the metallic plates (80) and the wedge devices or the casting material or the foam material.

17. Electronic module (1) according to claim 16, in which forces exerted by the wedge devices acting transversely to the longitudinal direction (3) on the accumulators or accumulator packs can be adjusted by means of adjustment screws which are supported on the metallic plates (80).

18. Electronic module (1) according to claim 1, in which an electric machine (200) is mounted in the housing (2) with its rotational axis oriented in the longitudinal direction (3) of the electronic module (1), wherein the stator assembly (220) is fixed to the housing and the rotor assembly (210) is mounted by means of a rotor shaft (230) in rotary bearings (240) which are applied to metallic plates (80) arranged in the housing (2) transversely to the longitudinal direction.

19. Electronic module assembly with at least one first electronic module (1) according to claim 18 comprising an electric machine (200) and at least one second electronic module (1) according to one of claims 1 to 17, comprising at least one first circuit board (110) and/or at least one second circuit board (120), wherein electrical power and/or communication signals can be transmitted by means of second circuit boards (120) between the electronic modules (1) and additionally, between the electronic modules (1) which comprise electric machines (200), mechanical power can be transmitted via rotationally fixed connections of the rotor shafts (230) of the electric machines.

20. Electronic module assembly according to claim 19, wherein power and/or communication signals can be transmitted between the rotor assemblies (210) and/or the stator assemblies (220) and the first circuit boards (110) or electronic components (100) via cables.

* * * * *